US011016050B2

(12) United States Patent
Mamigonians

(10) Patent No.: US 11,016,050 B2
(45) Date of Patent: May 25, 2021

(54) EXAMINING OBJECTS WITH ELECTRIC FIELDS

(71) Applicant: Zedsen Limited, London (GB)

(72) Inventor: Hrand Mami Mamigonians, London (GB)

(73) Assignee: Zedsen Limited, London (GB)

( * ) Notice: Subject to any disclaimer, the term of this patent is extended or adjusted under 35 U.S.C. 154(b) by 214 days.

(21) Appl. No.: 16/201,015

(22) Filed: Nov. 27, 2018

(65) Prior Publication Data

US 2019/0170676 A1 Jun. 6, 2019

(30) Foreign Application Priority Data

Dec. 6, 2017 (GB) ...................................... 1720335

(51) Int. Cl.
*G01R 27/26* (2006.01)
*G01N 27/22* (2006.01)
(Continued)

(52) U.S. Cl.
CPC ......... *G01N 27/228* (2013.01); *G01N 27/028* (2013.01); *G01R 29/14* (2013.01)

(58) Field of Classification Search
CPC ......... B60N 2/002; G01L 1/142; G01L 1/146; G01L 5/165; A61B 2562/0214;
(Continued)

(56) References Cited

U.S. PATENT DOCUMENTS 3,855,595 A * 12/1974 Jensen ...................... G01S 7/22
342/192
5,551,288 A * 9/1996 Geraldi .................. B64D 15/20
324/671
(Continued)

FOREIGN PATENT DOCUMENTS

CN 106959325 A 7/2017
CN 107422002 A 12/2017
(Continued)

OTHER PUBLICATIONS

Corresponding Great Britain Patent Application No. GB1819773.1, Search Report, dated May 31, 2019.
(Continued)

*Primary Examiner* — Alesa Allgood
(74) *Attorney, Agent, or Firm* — Cooper Legal Group, LLC

(57) ABSTRACT

Objects are examined using electric fields (3201, 3202, 3203, 3204, 3205, 3206, 3207) created by a first set of electrodes (1101 to 1108). A selected electrode (1108) from the first set is energized as a transmitter and a different selected electrode (1107) is monitored as a receiver, to establish a capacitively coupled pair of electrodes defining a coupling operation. Two electrodes are (1107, 1108) are selected that are separated by a first distance as a first coupled pair during a first coupling operation. During a second coupling operation, two electrodes (1106, 1108) are selected that are separated by a second distance, where the second distance is larger then the first distance. The first coupled pair and the second coupled pair both include a first electrode in common (1108).

20 Claims, 32 Drawing Sheets

(51) Int. Cl.
*G01N 27/02* (2006.01)
*G01R 29/14* (2006.01)

(58) Field of Classification Search
CPC ...... A61B 2562/046; A61B 2562/0247; A61B 2503/04; A61B 5/053; G01N 27/22; G01N 27/228; G01R 29/14
See application file for complete search history.

(56) References Cited

U.S. PATENT DOCUMENTS

| | | | |
|---|---|---|---|
| 2011/0062969 A1* | 3/2011 | Hargreaves | G06F 3/0443 |
| | | | 324/658 |
| 2011/0175847 A1 | 7/2011 | Wang et al. | |
| 2013/0088245 A1 | 4/2013 | Sezginer | |
| 2015/0002168 A1 | 1/2015 | Kao et al. | |
| 2019/0170676 A1* | 6/2019 | Mamigonians | G01R 29/14 |

FOREIGN PATENT DOCUMENTS

| | | |
|---|---|---|
| GB | 1277334 | 6/1972 |
| GB | 2279756 A | 1/1995 |
| GB | 2521207 A | 6/2015 |

OTHER PUBLICATIONS

Corresponding International Patent Application No. PCT/GB2018/000150, International Search Report, dated Feb. 14, 2019.
Corresponding Great Britain Search Report, Application No. 1720335.7 dated Jun. 5, 2018.

* cited by examiner

EXAMINING OBJECTS WITH ELECTRIC FIELDS

CROSS REFERENCE TO RELATED APPLICATIONS

This application claims priority from United Kingdom Patent Application number 1720335.7, filed on Dec. 6, 2017, the whole contents of which are incorporated herein by reference.

BACKGROUND OF THE INVENTION

The present invention relates to an apparatus for examining objects using electric fields. The present invention also relates to a method of examining objects using electric fields created by a first set of electrodes.

It is known to use electric fields to examine objects and, in particular, to examine the electrical properties of objects, including electrical conductivity and electrical permittivity. A first-electrode is energised during a first-strobing-operation and a second-electrode is monitored. In order to penetrate further into the object being examined, it is known to increase the distance between the first-electrode and the second-electrode. Thus, it is known to energise a first-electrode and monitor a second-electrode in order to perform an examination of a first depth, whereafter it is possible to then energise a third-electrode and monitor a fourth-electrode on a second-strobing-operation, where the displacement between the third-electrode and the fourth-electrode is greater than the displacement between the first-electrode and the second-electrode. However, with this construction, a problem arises in that the electrodes are dedicated to performing scanning operations at particular depths such that, for a stationary object, the particular depth under consideration will be determined by the position of the object upon the detector itself. Consequently, important regions may be missed and the extent to which further optimisation procedures may be adopted is somewhat limited.

BRIEF SUMMARY OF THE INVENTION

According to a first aspect of the present invention, there is provided an apparatus for examining objects using electric fields, comprising: a first set of electrodes; an energising circuit for energising a selected one of said electrodes as a transmitter; a monitoring circuit for monitoring a selected one of said electrodes as a receiver, such that an energised transmitter electrode and a monitored receiver electrode establish a coupled pair of capacitively coupled electrodes during a coupling operation; and a processor, wherein said processor is configured to: select two of said electrodes separated by a first distance as a first coupled pair during a first coupling operation; and select two of said electrodes separated by a second distance as a second coupled pair during a second coupling operation; wherein: said second distance is larger than said first distance; and said first coupled pair and said second coupled pair both include a first electrode in common.

In an embodiment, the processor is also configured to sequentially select further coupled pairs of electrodes from said first set during respective coupling operations, each including said first electrode in common. The processor may be further configured to sequentially select further coupled pairs of electrodes during respective coupling operations, wherein each said further coupled pair includes a second electrode in common. Furthermore, the first set comprises between four and eight electrodes, having a first end electrode and a second end electrode. In addition, the processor may be configured to select said first end electrode as said first electrode in common; and select said second end electrode as said second electrode in common.

According to a second aspect of the invention, there is provided a method of examining objects using electric fields created by a first set of electrodes, in which: a selected electrode from said first set is energised as a transmitter; and a different selected electrode is monitored as a receiver, to establish a capacitively coupled pair of electrodes defining a coupling operation, comprising the steps of: selecting two electrodes of said first set separated by a first distance as a first coupled pair, during a first coupling operation; and selecting two electrodes separated by a second distance as a second coupled pair, during a second coupling operation, wherein: said second distance is larger than said first distance; and said first coupled pair and said second coupled pair both include a first electrode in common.

Embodiments of the invention will be described, by way of example only, with reference to the accompanying drawings. The detailed embodiments show the best mode known to the inventor and provide support for the invention as claimed. However, they are only exemplary and should not be used to interpret or limit the scope of the claims. Their purpose is to provide a teaching to those skilled in the art. Components and processes distinguished by ordinal phrases such as "first" and "second" do not necessarily define an order or ranking of any sort.

DETAILED DESCRIPTION OF EMBODIMENTS OF THE INVENTION

FIG. 1

Figure 1:
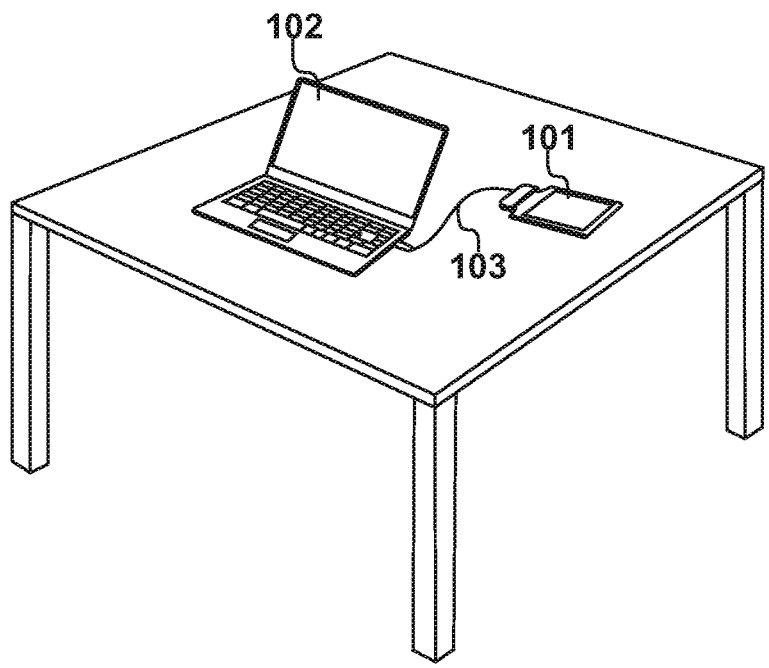
FIG. 1 shows an examination-apparatus communicating with a data-processing-system.

An examination apparatus 101 is shown in FIG. 1, for examining electrical properties of objects, using electric fields. The examination apparatus 101 communicates with a data processing system 102 via a data-communication cable 103, possibly designed in accordance with established USB protocols.

In an alternative embodiment, wireless communication is provided between the examination apparatus 101 and the data-processing system 102.

FIG. 2

Figure 2:
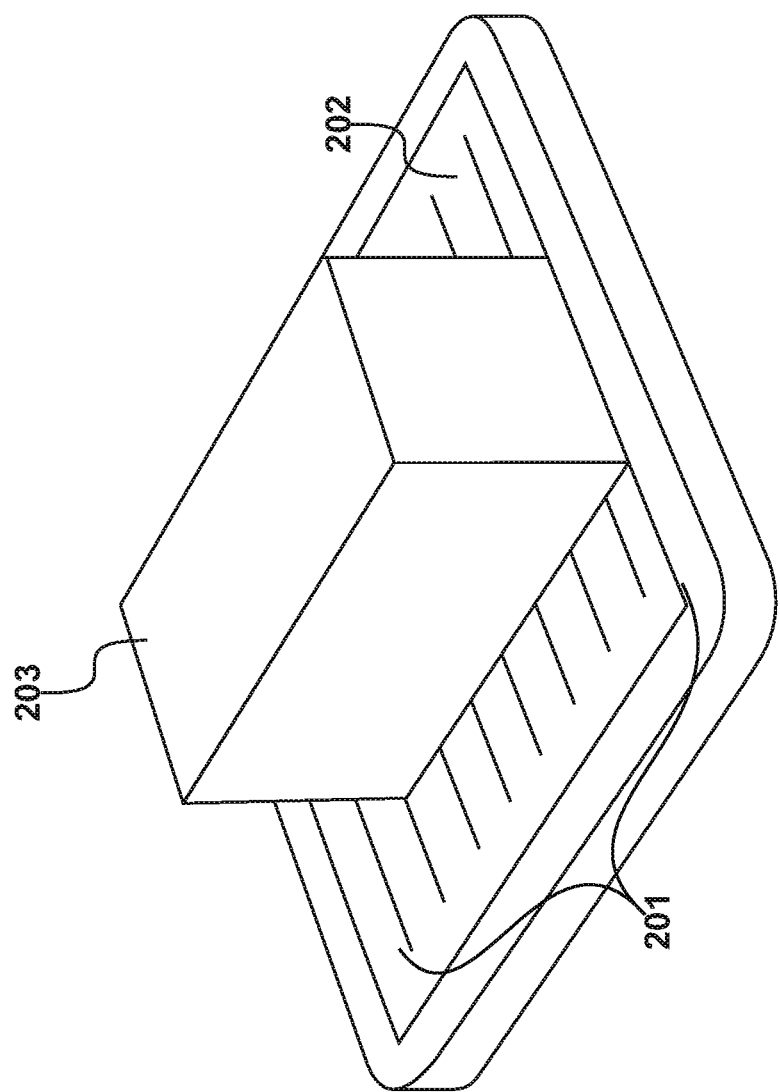
FIG. 2 details the examination-apparatus identified in FIG. 1.

The examination apparatus 101 is shown in greater detail in FIG. 2. The apparatus includes a group of n substantially parallel electrodes 201 mounted on a dielectric membrane 202. In this example, eight electrodes are included in the group; that is to say, n equals eight. However, it should be appreciated that substantially more electrodes may be included and various possibilities exist in terms of the physical arrangement of the electrodes on the dielectric membrane. The group of electrodes are also covered by an insulating material to ensure that the surface of the examination apparatus is non-conductive.

The examination apparatus 101 is arranged to examine the electrical properties of entities, such as an object 203. In known systems of the type illustrated in FIG. 2, electrodes have dedicated functionality; in that they are either energised to provide a transmitter electrode, or monitored to provide a receiver electrode. Thus, in known systems, each electrode is identified exclusively as a dedicated input electrode or a dedicated output electrode.

The present invention provides a more sophisticated approach in which it is possible to derive more information concerning the nature of the object 203. Two electrodes are selected that are separated by a first distance as a first coupled pair during a first coupling operation. Thereafter, two electrodes are selected that are separated by a second distance as a second coupled pair during a second coupling operation, wherein the second distance is larger than the first distance. However, in order to achieve greater resolution, the first coupled pair and the second coupled pair both include a first electrode in common.

An implementation of the present invention provides for repeatedly energising a first electrode of the set and then sequentially monitoring the second to the nth remaining electrodes of the set. Thereafter, the nth member of the set is repeatedly energised as a second common electrode and the first electrode to the n minus one (n−1) are sequentially monitored.

Using the approach identified above, electric fields pass through the object 203 between different selected electrodes, such that the distance between the electrodes varies. By achieving this variation, the electric fields penetrate to different depths into the object, thereby further information to be obtained. However, by allowing electrodes to perform both transmission and reception activities, without being dedicated to one or the other, it is possible to optimise the amount of information that is received from a finite number of coupling operations performed during a finite scanning cycle.

As described in greater detail with reference to FIG. 6, a processing means includes a first multiplexer for selectively supplying energising signals and a second multiplexer for selectively monitoring the remaining electrodes. In this way, each electrode may be configured as a transmitter or as a receiver; provided that no single electrode is configured to do both during the same strobing operation.

FIG. 3

Figure 3:
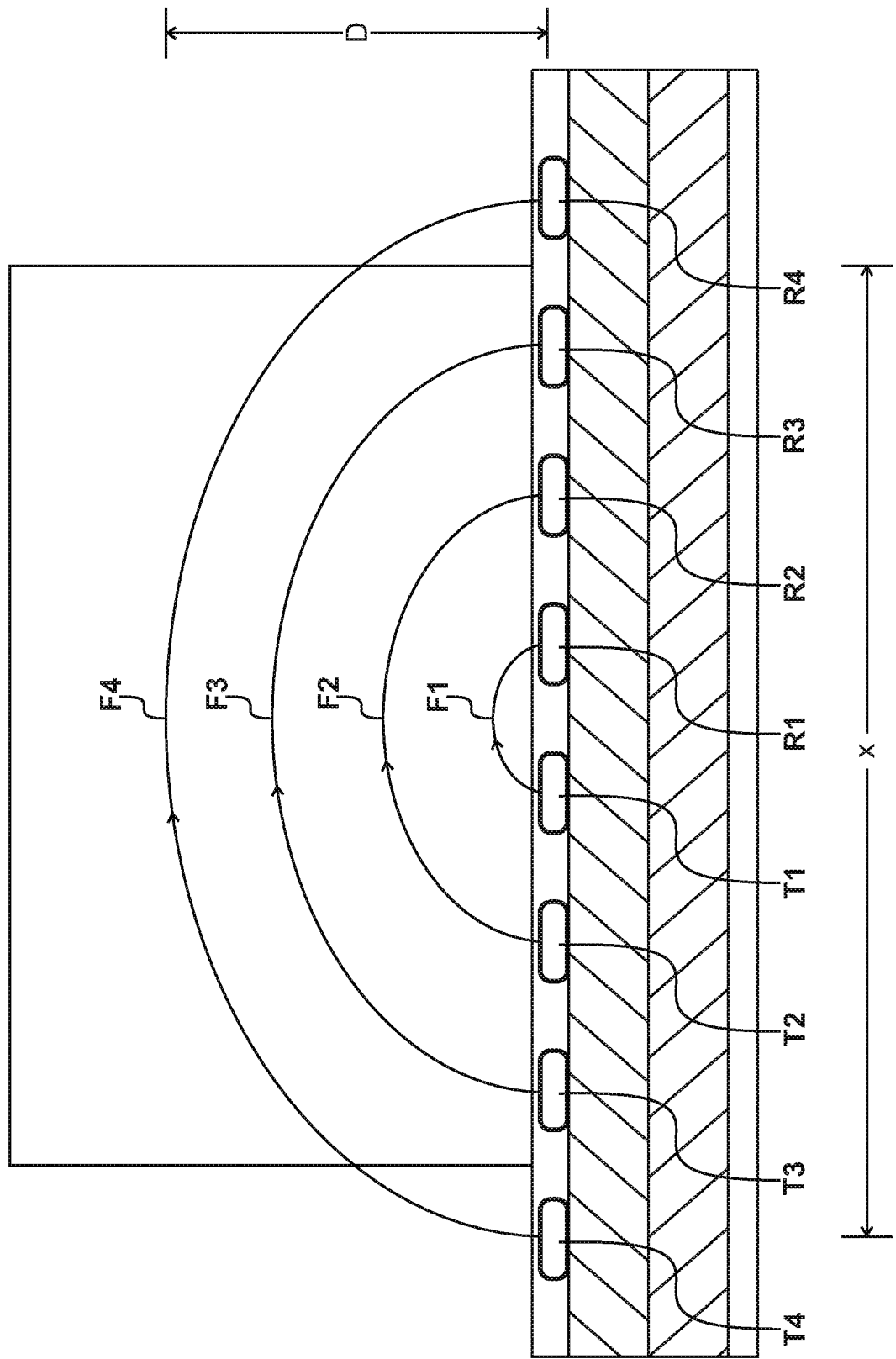
FIG. 3 illustrates an example of a known examination technique.

An example of an examination apparatus is illustrated in FIG. 3, configured to provide a known type of functionality that provides for a degree of examination with respect to the depth of the object.

In the example of FIG. 3, eight electrodes have been provided. A first four of these electrodes have been configured as transmitter electrodes and, as such, are identified as T1, T2, T3 and T4. Similarly, the other electrodes are dedicated as receiver electrodes and are identified as R1, R2, R3 and R4.

As is known in the art, with a spacing x between a transmitter electrode and a receiver electrode, it is possible to achieve a degree of depth penetration D. To a first approximation, the value of is equal to half the value of x.

As illustrated in FIG. 3, it is possible to energize transmitter electrode T1, transmitter electrode T2, transmitter electrode T3, or transmitter electrode T4. During the energisation of transmitter electrode T1, receiver electrode R1 is monitored. This results in an electric field F1 achieving a first depth. Thereafter, transmitter electrode T2 is energized and receiver electrode R2 is monitored, which creates a second electric field F2. Transmitter electrode T3 is energized with receiver electrode R3 being monitored to achieve a third electric field F3. Transmitter electrode T4 is energized and receiver electrode R4 is monitored to create a fourth electric field R4.

A problem with this approach is that when analysing electric fields that penetrate deeply in to the object, the measured response is also affected by material at lower levels. For a homogeneous object, the response detected for the lower levels, using transmitter T1 and receiver R1 for example, may allow for a degree of compensation to be performed. However, with complex objects, such as organic organs for example, the usefulness of responses from the approach illustrated in FIG. 3 is somewhat limited.

The present invention provides a flexible platform upon which many variations are possible in order to obtain rich depth data. Furthermore, the platform also facilitates a particular forward/reverse layering technique that optimises the data received for the number of strobing operations performed.

FIG. 4

Figure 4:
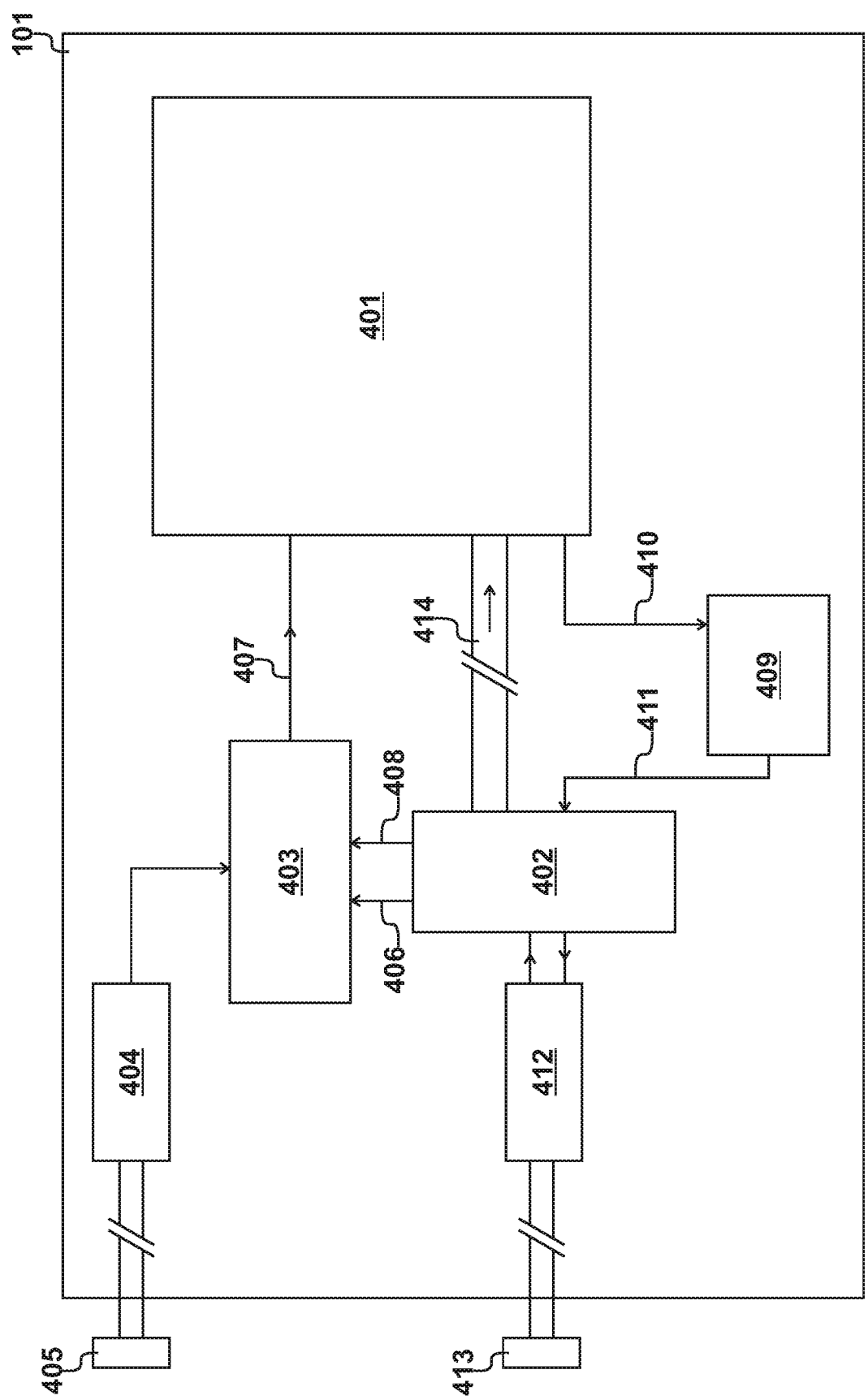
FIG. 4 shows a schematic representation of the examination-apparatus shown in FIG. 2.

A block diagram of the workings of the examination apparatus 101 is illustrated in FIG. 4. In FIG. 4, the dielectric membrane 202, with the group 201 of parallel electrodes, is included within a multiplexing environment 401. In addition to the dielectric membrane 202, the multiplexing environment 401 also includes a de-multiplexer for selectively de-multiplexing energising input pulses, along with a multiplexer for monitoring selected output signals.

A processor 402, implemented as a microcontroller in an embodiment, controls the demultiplexer and the multiplexer to ensure that the same electrode cannot both be energized and monitored during the same coupling operation. An energizing circuit 403 is energized by a power supply 404 that in turn may receive power from an external source via a power-input connector 405. A voltage-control line 406, from (a digital-to-analogue-convertor within) the processor 402 to the energizing circuit 403, allows the processor 402 to control the voltage (and hence the energy) of energising signals supplied to the multiplexing environment 401 via a strobing line 407. The timing of each strobing signal is controlled by the processor 402 via a trigger-signal line 408.

An output from the multiplexing environment 401 is supplied to an analog conditioning circuit 409 over a first analog line 410. A conditioning operation is performed, by the analog conditioning circuit 409, allowing analog output signals to be supplied to the microcontroller via a second-analog line 411. The processor 402 also communicates with a two-way-data-communication circuit 412, thereby allowing a data interface 413 to connect with the data-communication cable 103.

In operation, the processor 402 supplies addresses over address busses 414 to the multiplexing environment 401 to achieve the required functionality in accordance with embodiments of the present invention. Thus, having supplied addresses to the multiplexing environment 401, an energizing voltage is supplied via strobing line 407, resulting in an output signal being supplied to the processor 402 as part of a complete coupling operation. At the processor 402, a monitored analog signal is sampled to produce a digital representation that may be stored locally or uploaded to the data processing system 102 via the data interface 413.

FIG. 5

Figure 5:
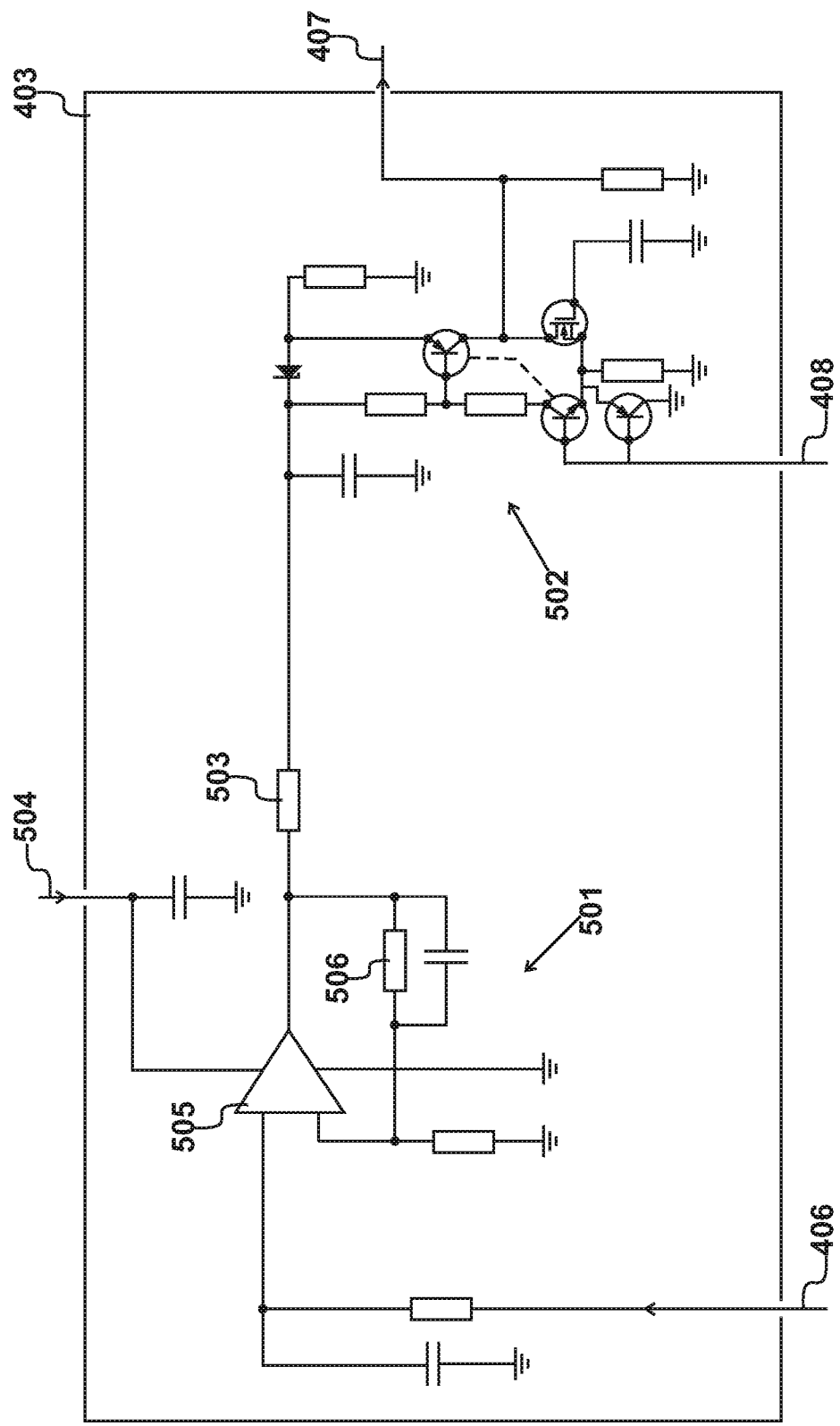
FIG. 5 details an energising circuit identified in FIG. 4.

A schematic representation of the energizing circuit 403 is shown in FIG. 5. The energizing circuit 403 includes a voltage-control circuit 501 connected to a strobing circuit 502 via a current limiting resistor 503.

A voltage-input line 504 receives energising power from the power supply 404 to energize an operational amplifier 505. The operational amplifier 505 is configured as a comparator and receives a reference voltage via a feedback resistor 506. This is compared against a voltage-control signal received on the voltage-control line 406 to produce an input voltage for the strobing circuit 502.

In the embodiment of FIG. 5, the strobing circuit 502 includes two bipolar transistors configured as a Darlington pair, in combination with a MOSFET. This creates strobing pulses with sharp rising edges and sharp falling edges, that are conveyed to the strobing line 407, after receiving a triggering signal on the trigger-signal line 408.

FIG. 6

Figure 6:
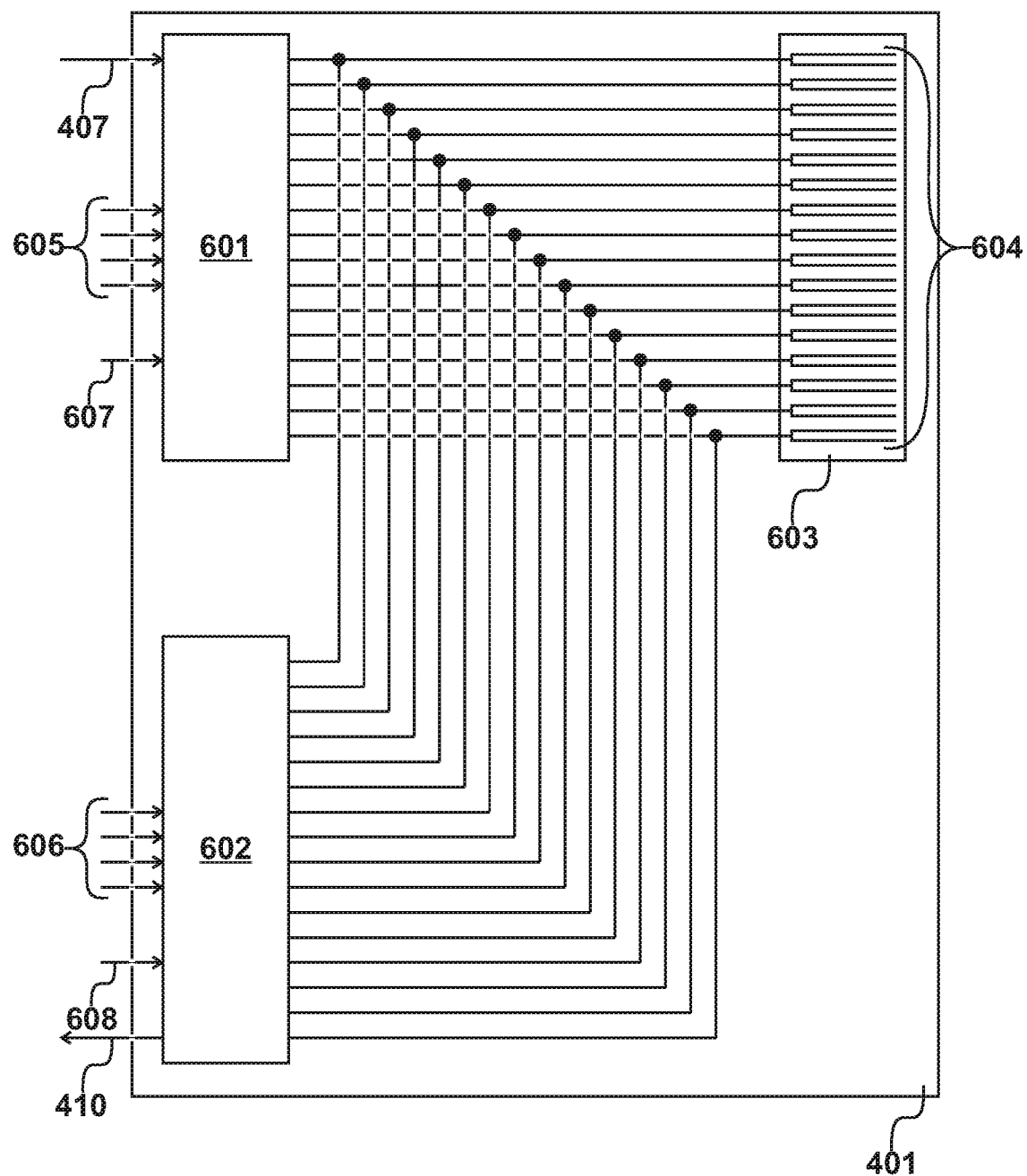
FIG. 6 details a multiplexing-environment identified in FIG. 4.

An example of the multiplexing environment 401 is detailed in FIG. 6. A first multiplexing device 601 supplies energizing input pulses and a second-multiplexing device 602 monitors analog output signals. In this alternative embodiment, a dielectric membrane 603 supports a group of sixteen parallel electrodes 604, but a similar approach can be taken for a group of fewer electrodes, say eight, or a group of more electrodes, say thirty-two. In an embodiment, the group of sixteen electrodes may be divided into a first set of eight and a second set of eight, whereby similar operations are performed upon each set during a scanned cycle.

The address busses 414 include an input-address bus 605, and an output-address bus 606, for addressing the first multiplexing device 601 and the second multiplexing device 602 respectively. The addressing space for the input-address bus 605 and the addressing space for the output-address bus 606 may be similar, which may assist with ensuring that the same address cannot be supplied simultaneously to both the input-address bus 605 and the output-address bus 606.

The first multiplexing device 601 also includes a first-enabling line 607. Similarly, the second multiplexing device 407 includes a second enabling line 608. In operation, addresses are supplied to the input-address bus 605 and to the output-address bus 606 but line selection does not actually occur until the multiplexing devices receive a respective enabling signal.

The first multiplexing device 601 receives an input pulse from the energizing circuit 403 via the strobing line 407. Multiple coupling operations are performed, such that an input energizing voltage is supplied to electrodes performing a transmitter function. Strobing signals are distributed to multiple inputs; therefore, the first multiplexing device 601 should be seen as performing a de-multiplexing operation.

The second multiplexing device 602 performs a multiplexing operation, in that multiple output signals are selected sequentially and then combined onto the first analog line 410, for reception by the monitoring circuit 409. Thus, in this embodiment, the multiplexing environment is established by a single first multiplexing device for input signals and a single second multiplexing device for output signals, both of which are connected to all sixteen of the available electrodes. If a greater number of electrodes are present upon a dielectric membrane, it is possible for additional multiplexing devices to be provided such that, for example, a pair of multiplexing devices may provide the input de-multiplexing function and a further pair of multiplexing devices may provide the multiplexing output function.

During a strobing operation, an input address is supplied on the input-address bus 605 and an output address is supplied on the output-address bus 606. The addresses are enabled such that, at a particular point in time, the output multiplexer 602 is enabled and is therefore configured to monitor output signals on the addressed output electrodes. The selected input electrode is then energized by the application of a strobing pulse.

A predetermined delay occurs before a sample of the voltage monitored on the output electrode is taken at a sampling instant. In this embodiment, the first-monitoring line 410 applies an output analogue voltage to the analog processing circuit 409 for the duration of the coupling operation. The analog voltage is conditioned by the analog processing circuit 409, which in turn supplies a conditioned voltage to the microcontroller 402 via the second monitoring line 411. Digital-to-analog conversion then takes place within the microcontroller 402, such that the point at which the sampling instant occurs is determined by the microcontroller.

FIG. 7

Figure 7:
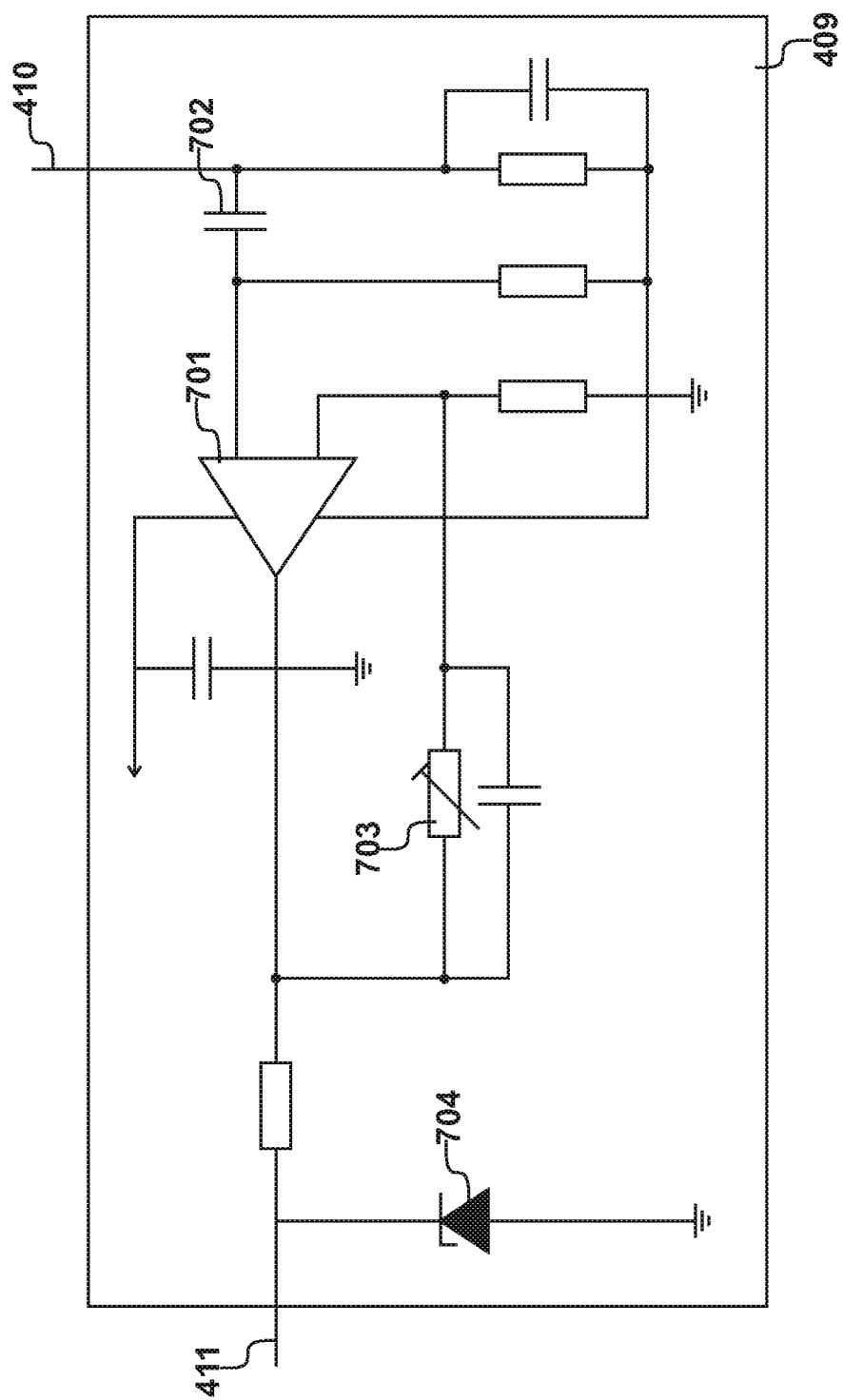
FIG. 7 details an analog processing circuit identified in FIG. 4.

An example of an analog processing circuit 409 is illustrated in FIG. 7. Signals received on the first analog line 410 are supplied to a buffering amplifier 701 via a decoupling capacitor 702. During an initial set-up procedure, a variable feedback resistor 703 is trimmed to optimize the level of monitored signals supplied to the processor 402 via the second monitoring line 411. A Zener diode 704 prevents excessive voltages being supplied to the processor 402.

FIG. 8

Figure 8:
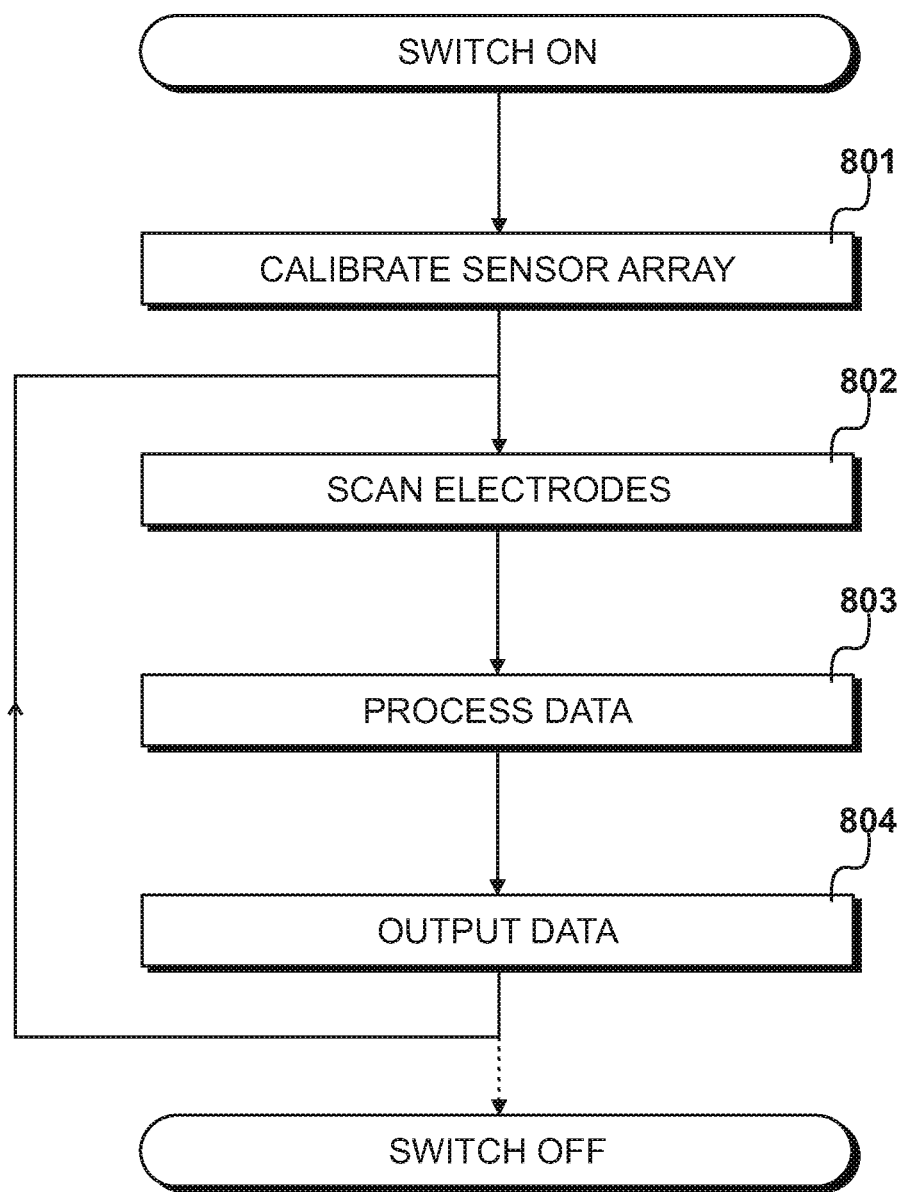
FIG. 8 shows an overview of procedures performed by the processor identified in FIG. 4.

Procedures performed by the processor 402 are illustrated in FIG. 8. After an initial switch on, possibly initiated by the data processing system 102, the examination apparatus is calibrated at step 801. This enables a reference level to be established, prior to the application of an object, such as object 205.

After the application of an object, the electrodes are scanned at step 802. Each scan consists of a plurality of coupling operations, with each coupling operation engaging a unique combination of transmitter electrode and receiver electrode.

At step 803, data is processed and the degree of local data processing will depend upon the processing capabilities provided by the processor 402. In an embodiment, the level of received monitored signals may be compared against a reference and, where appropriate, a control voltage on the voltage-control line 406 may be adjusted. Furthermore, in an embodiment, the control voltage may be adjusted when deeper penetration is required.

More sophisticated processing may be achieved by the data processing system 102, therefore output data is supplied to the data processing system 102 at step 804. Thereafter, further scanning is performed at step 802 and the procedures are repeated until a de-activation command is received.

FIG. 9

Figure 9:
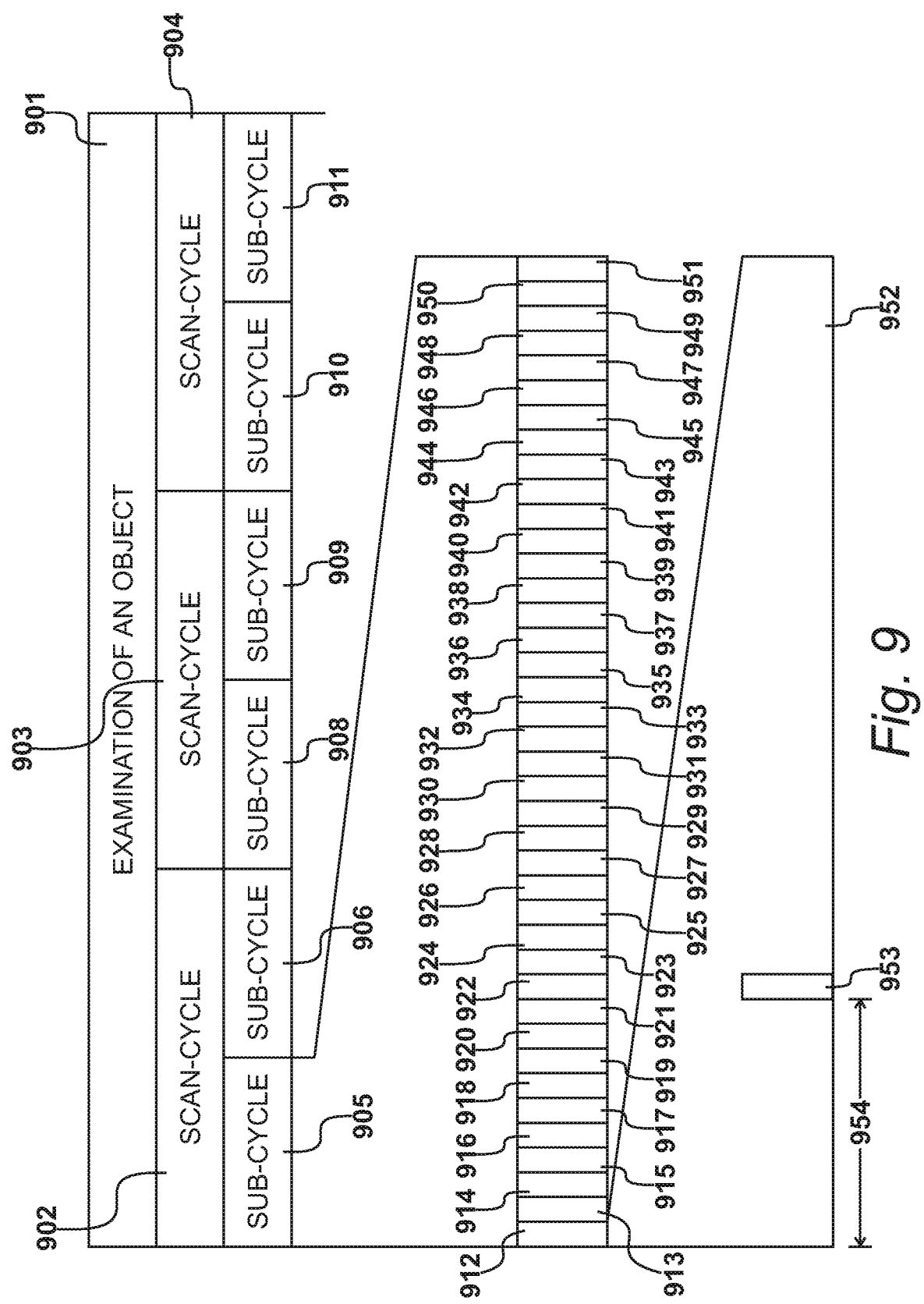
FIG. 9 illustrates the procedures performed during the examination of an object.

During a working period, many objects may be examined. The duration of an individual examination is illustrated in FIG. 9 and similar procedures are performed for each object. An examination for a particular object starts by arranging the object on the apparatus, as shown in FIG. 2.

During an examination process 901 transmitter electrodes are energized and receiver electrodes are monitored. Such a procedure may be referred to informally as scanning. As used herein, a complete scan cycle is performed when all required combinations of transmitters and receivers have been exercised. Thus, during examination process 901, many scan-cycles may be performed. For the purposes of this illustration, during examination-process 901, a first-scan cycle 902 is performed, followed by a similar second-scan cycle 903 and a similar third-scan cycle 904.

A particular scan cycle may be represented as a particular unique pattern of energizing and monitoring operations. In an embodiment, a scan cycle is not completed until all of the available electrodes have been energized and all of the available electrodes have been monitored. However, such a procedure may take a significant amount of time and in alternative embodiments, selected electrodes are energized and selected electrodes are monitored, in an attempt to optimize the level of data received while minimising the number of coupling operations required. In this way, it is possible to repeat the scan cycle more times during the examination of an object and, in some circumstances, make changes to other operating conditions; again, with a view to optimizing the quality of the data received.

In an embodiment, it is also possible to identify a particular scanning pattern that may be repeated at different positions within the array of available electrodes. In an embodiment, the array may be divided; with a similar scanning pattern being deployed upon each set of electrodes.

In the embodiment of FIG. 2, eight electrodes are available and a complete scan cycle may involve all of these electrodes, whereafter a similar pattern is repeated for the next scan cycle. In the embodiment of FIG. 6, sixteen electrodes are available and again a similar scanning operation could be performed with reference to all sixteen electrodes before the scanning-cycle is repeated. However, as an alternative approach, it is possible to divide the sixteen-electrode array into two sets of eight electrodes. The first set undergoes a scanning cycle, whereafter the second set undergoes a similar scanning cycle. A complete scan cycle therefore involves performing operations with the first set followed by similar operations on the second set. Consequently, it is possible to identify the first set of scanning-operations as being within a first sub cycle 905, with the second set of operations falling within a second sub cycle 906. Thus, scan cycle 902 now comprises sub cycle 905 and sub cycle 906.

Similarly, the second scan cycle 903 is made up of a third sub cycle 908 followed by a fourth sub cycle 909. Thereafter, the third scan cycle 904 is implemented by a fifth sub cycle 910 followed by a sixth sub cycle 911.

Each sub cycle 904 to 911 involves a similar set of coupling operations, representing a similar coupling pattern performed upon the selected set of electrodes. These may consist of a first coupling operation 912, followed by a second coupling operation 913, followed by a third coupling operation 914, followed by a fifth coupling operation and so on, until the fortieth coupling operation 951, in this example. Thereafter, similar coupling operations are performed for the next sub cycle 906. However, the particular number of coupling operations performed within each sub cycle will vary, depending upon the number of electrodes present within the set and the particular pattern deployed in order to derive the required data.

Each coupling operation within a sub cycle is unique, in terms of the particular electrode selected as the transmitter in combination with the particular electrode selected as the receiver. Each coupling operation consists of energizing the selected transmitter electrode and monitoring the selected receiver electrode.

Due to capacitive coupling, each monitoring process monitors a voltage at the receiver electrode. To determine electrical properties of objects, a measurement is required. In an embodiment, this measurement is achieved by performing a process of analog-to-digital-conversion, thereby allowing the result of the conversion to be processed within the digital domain.

As illustrated in FIG. 9, a coupling operation, such as the first coupling operation 912, takes place within a monitored duration 952. Within the monitored duration 952, a sampling instant 953 occurs, representing an instant within the monitored duration 952 at which an output voltage is sampled.

In order to optimise results received from the examination process, the sampling instant 953 does not occur immediately following the generation of an input strobing signal. Although, in an embodiment, a sharp, rapidly rising strobing input signal is supplied to the transmitter electrodes, the shape of resulting output signals will not rise so steeply; as a result of the electrical properties of the device and the electrical properties of the objects being examined, Thus, to optimize the value of the information derived from the procedure, the sampling instant 953 is delayed by a predetermined delay period 954.

FIG. 10

Figure 10:
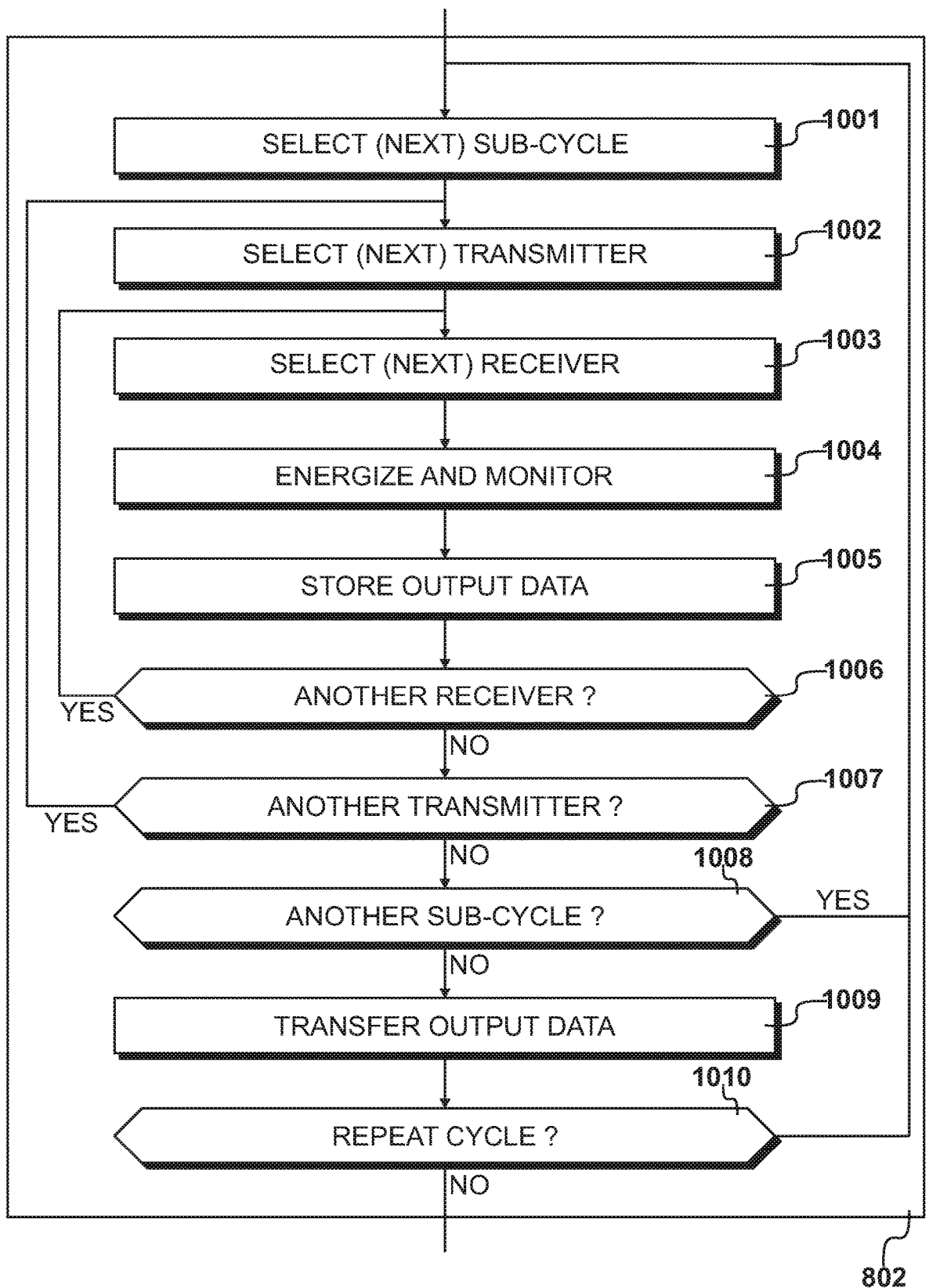
FIG. 10 details procedures performed by a processor during the examination of an object.

Procedures 802 performed by processor 402 during an examination of an object are illustrated in FIG. 10. At step 1001, a sub cycle is selected which, on a first iteration, would be the first sub cycle 905. As illustrated in FIG. 9, coupling operations are performed, starting with the first coupling operation 912. Thus, at step 1002, a transmitter is selected and at step 1003, a receiver is selected. The selected transmitter is energized at step 1004 and the selected receiver is monitored. Output data is then stored at step 1005, thereby completing the coupling operation.

In an embodiment, a layering procedure is performed by selecting a transmitter and then, following a plurality of energizations upon the selected transmitter, performing a plurality of monitoring functions against a selection of receivers. As the selected receiver moves further away from the transmitter, the distance x between the energized electrode and the monitored electrode increases, therefore the average depth of penetration also increases.

Thus, if the question asked at step 1006 is answered in the affirmative, to the effect that another receiver is to be deployed, the next receiver is selected at step 1003 and a further energization occurs at step 1004. These procedures repeat until the question asked at step 1006 is answered in the negative, confirming that all of the receivers have been considered.

At step 1007, a question is asked as to whether another transmitter is to be energized within the sub cycle and when answered in the affirmative, the next transmitter is selected at step 1002. Thereafter, the next receiver is selected and an energization is performed at step 1004. Thus, for the second selected transmitter, a plurality of receivers may be selected by repeated activation at step 1003.

Eventually, all of the transmitters will have been considered and the question asked at step 1007 will be answered in the negative. A question is then asked at step 1008 as to whether a further sub cycle is to be performed and when answered in the affirmative, the next sub cycle is selected at step 1001. Thus, having completed the first sub cycle 905, the second sub cycle 906 is selected at step 1001.

Procedures performed for the second sub cycle 906 are similar to those performed for the first sub cycle 905. However, an offset occurs in terms of the particular electrodes selected, such that the first sub cycle 905 may engage a first set of electrodes with the second sub cycle 906 selecting a second set of electrodes. The complete scan cycle 902 is only completed when the first set (for the first sub cycle 905) and the second set (for the second sub cycle 906) have been considered. Thereafter, the whole process is repeated during the second scan cycle 903.

FIG. 11

Figure 11:
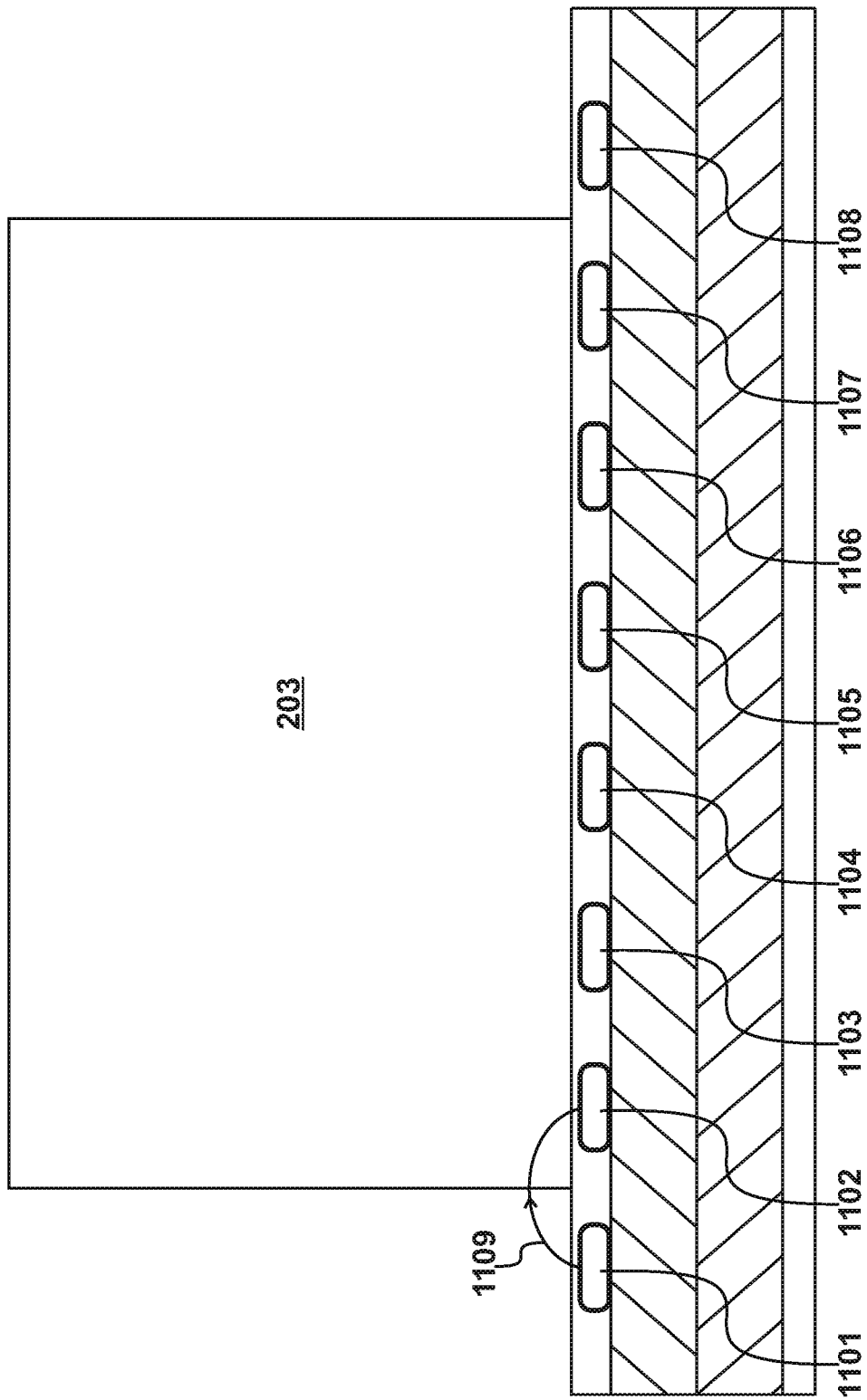
FIG. 11 shows a first coupling operation of a first embodiment.
Figure 12:
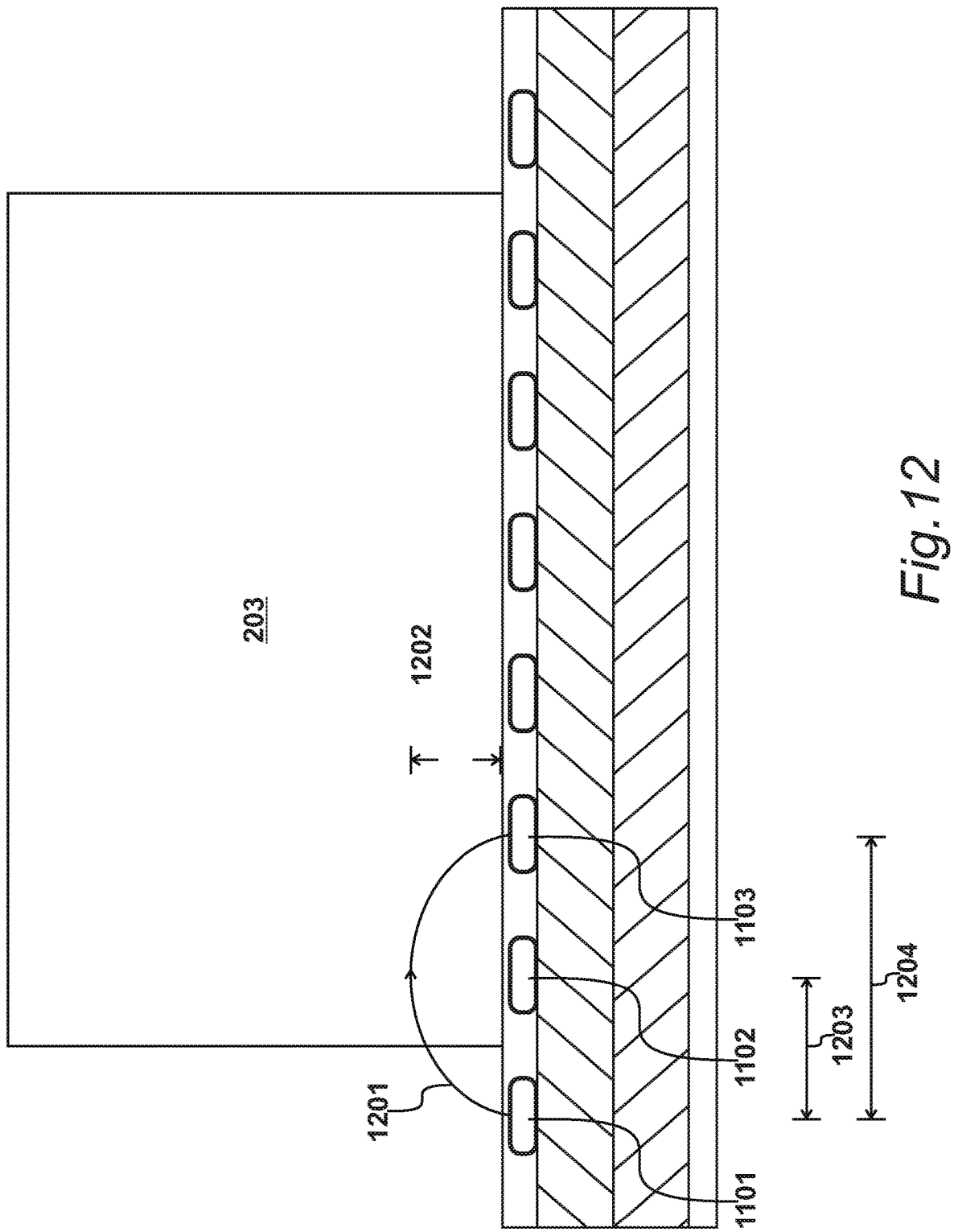
FIG. 12 shows a second coupling operation of the first embodiment.

The procedures described with reference to FIG. 10 provide a method of using electric fields to examine objects. As shown in FIG. 2, an object is arranged on an examination apparatus having a first electrode 1101, a second electrode 1102 and a third electrode 1103. The method provides for energizing the first electrode 1001 during a first coupling operation 912 of a scan cycle 907. The second electrode 1102 is monitored during the first coupling operation 912. Thereafter, during the second coupling operation 914, the first electrode 1001 is energised again, during which the third electrode 1003 is monitored. Thus, the method examines objects using electric fields created by a first set of electrodes. A selected electrode from this set is energized as a transmitter and a different selected electrode is monitored as a receiver, to establish a capacitively coupled pair of electrodes defining a coupling operation. Two electrodes are selected from the first set, as shown in FIG. 11, separated by a first distance as a first coupled pair, during a first coupling operation. Thereafter, as shown in FIG. 12, two electrodes are selected that are separated by a second distance as a second coupled pair during a second coupled operation, with the second distance being larger than the first distance. The first coupled pair of FIG. 11 therefore involves, in this example, the first electrode 1101 and the second electrode 1102. This is then followed by the coupling operation illustrated in FIG. 12 in which the first electrode 1101 is coupled with the third electrode 1103. The electric field 1201 penetrates further into the object 203 than electric field 1109. This is achieved by selecting electrode 1103 for the pair as an alternative to electrode 1102. However, during both operations, electrode 1101 is selected therefore the first electrode 1101 represents a first electrode in common that continues to be used for subsequent coupling operations.

In the example of FIG. 1, the first electrode 1101 is selected as the transmitter and the second electrode 1102 is selected as the receiver. However, it is the coupling between these electrodes that is relevant and the selection could occur with the second electrode 1102 selected as the transmitter and the first electrode 1101 selected as the receiver. Similarly, during the second operation as illustrated in FIG. 2, in this example, the first electrode 1101 (the first electrode in common) continues to operate as a transmitter electrode. However, it is the selected coupling that is relevant and for this second operation it would be possible for the third electrode 1103 to be activated as a transmitter with the first electrode 1101 selected as a receiver.

As illustrated in FIG. 11, during the first coupling operation 912, involving the energization of the first electrode 1101 and the monitoring of the second electrode 1102, an electric field 1109 penetrates the object 203.

The embodiment of FIG. 11 also includes a fourth electrode 1104, a fifth electrode 1105, a sixth electrode 1106, a seventh electrode 1107 and an eighth electrode 1108. In the embodiment of FIG. 2, this completes the group 201 of available electrodes. Alternatively, the eight electrodes 1101 to 1108 may be seen as a first set of the group 604 of sixteen electrodes in the embodiment shown in FIG. 6. In this second embodiment, electrodes 1101 to 1108 are deployed during a first sub cycle 905, followed by a similar second set being deployed during a second cycle 906.

FIG. 12

The first coupling operation 912, described with reference to FIG. 9, is followed by a second coupling operation 913, as illustrated in FIG. 12. For this second coupling operation 913, the first electrode 1101 is energized again. However, instead of monitoring the second electrode 1102, the third electrode 1103 is monitored. This again results in the generation of an electric field 1201 which again penetrates the object 203. However, on this occasion, the distance between the two coupled electrodes has increased, therefore electric field 1201 penetrates the object 203 by a greater depth 1202.

In an embodiment, as described with reference to FIG. 2, the first electrode 1101, the second electrode 1102 and the third electrode define parallel tracks. However, it should be appreciated that alternative configurations are possible. Furthermore, in some embodiments, it is possible for a first electrode to be deployed on one side of the dielectric membrane with the second electrode being deployed on the other side of the dielectric membrane. However, in the embodiment described with reference to FIG. 2, the second electrode 1102 is separated from the first electrode by a first distance 1203. The third electrode 1103 is separated from the first electrode by a second distance 1204. As shown in FIG. 12, the second distance 1204 is larger than the first distance 1203: such that the second coupling operation, shown in FIG. 12, penetrates deeper into the object 203 than the first coupling operation, shown in FIG. 11.

As described with reference to FIG. 4 and FIG. 5, it is possible for the processor 402 to control the output voltage from the energizing circuit 403. Consequently, in an embodiment, a first voltage is applied to the first electrode during the first coupling operation 912, as shown in FIG. 11 and a second voltage is applied to the first electrode 1101 during the second coupling operation 913, as shown in FIG. 12; where the second voltage is higher than the first-voltage.

FIG. 13

The multiplexing environment described with reference to FIG. 6 allows unlimited flexibility in terms of the electrodes that are energized and the electrodes that are monitored. Selections may be made, during a scanning cycle or sub cycle, to move the electric field from left to right over the examination apparatus. Consequently, different parts of the object 203 may be examined without actually moving the object itself. Furthermore, by making relative selections in terms of the transmitter electrode and the receiver electrode, the distance between the electrodes may be selected, which in turn controls the depth of penetration. Thus, in this way, it is possible to examine the nature of the object 203 at different depths. This is particularly attractive for objects that are not homogeneous and in particular for objects that may be considered as being formed from a plurality of layers. The selection of particular electrodes in order to influence the degree of penetration may therefore be referred to as layering; where a first selection provides information relating to a first layer and a second selection provides information relating to a second layer and so on.

Figure 13:
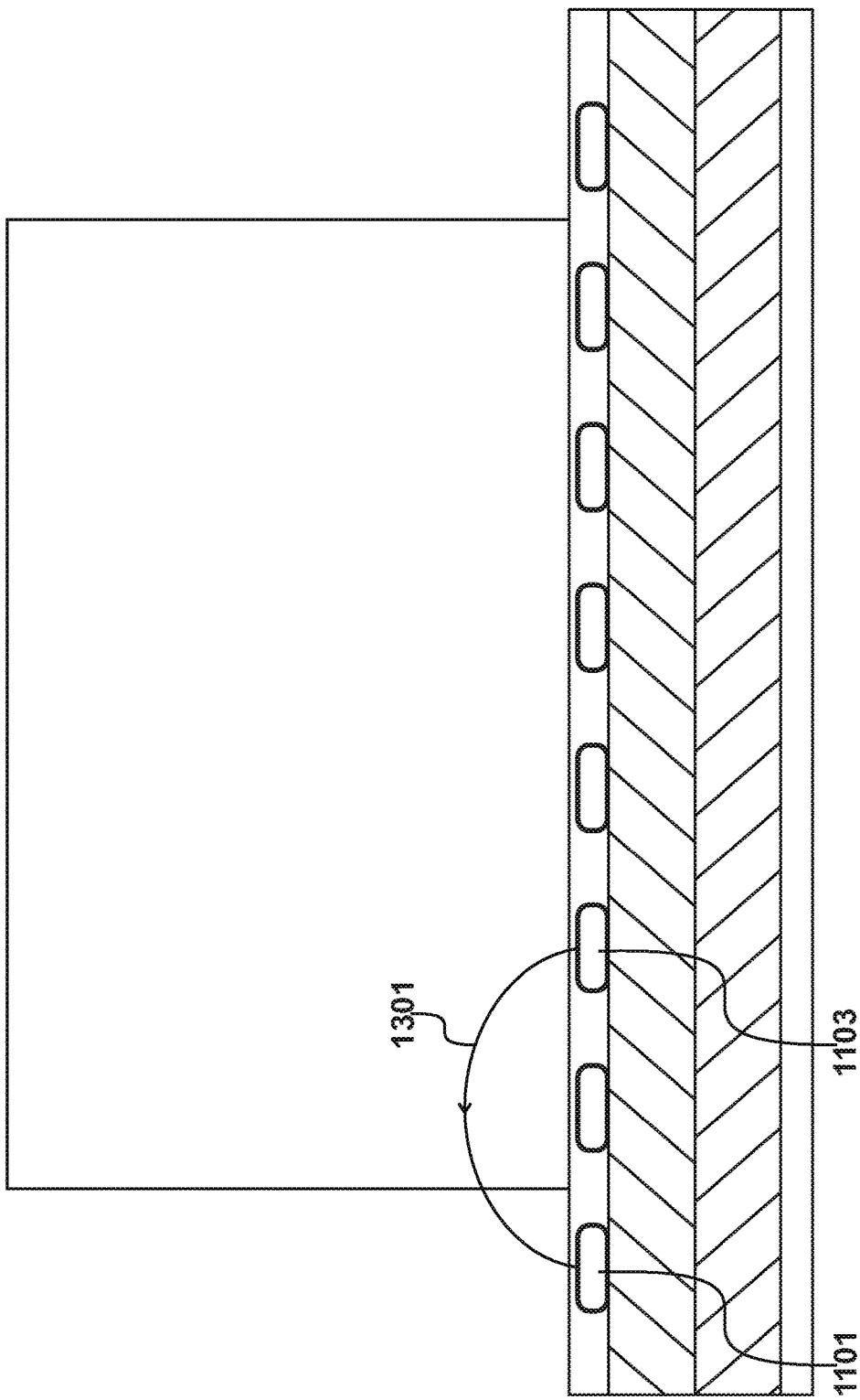
FIG. 13 shows a third coupling operation of the first embodiment.

A useful procedure for identifying rich information relating to layers has been identified as reverse layering. Thus, having completed the first coupling operation 912 and the second coupling operation 913, the third coupling operation 914 may consist of energising the third electrode 1103 and monitoring the first electrode 1101. Thus, the roles described with reference to FIG. 12 are reversed, as shown in FIG. 13. This generates an electric field 1301.

FIG. 14

Figure 14:
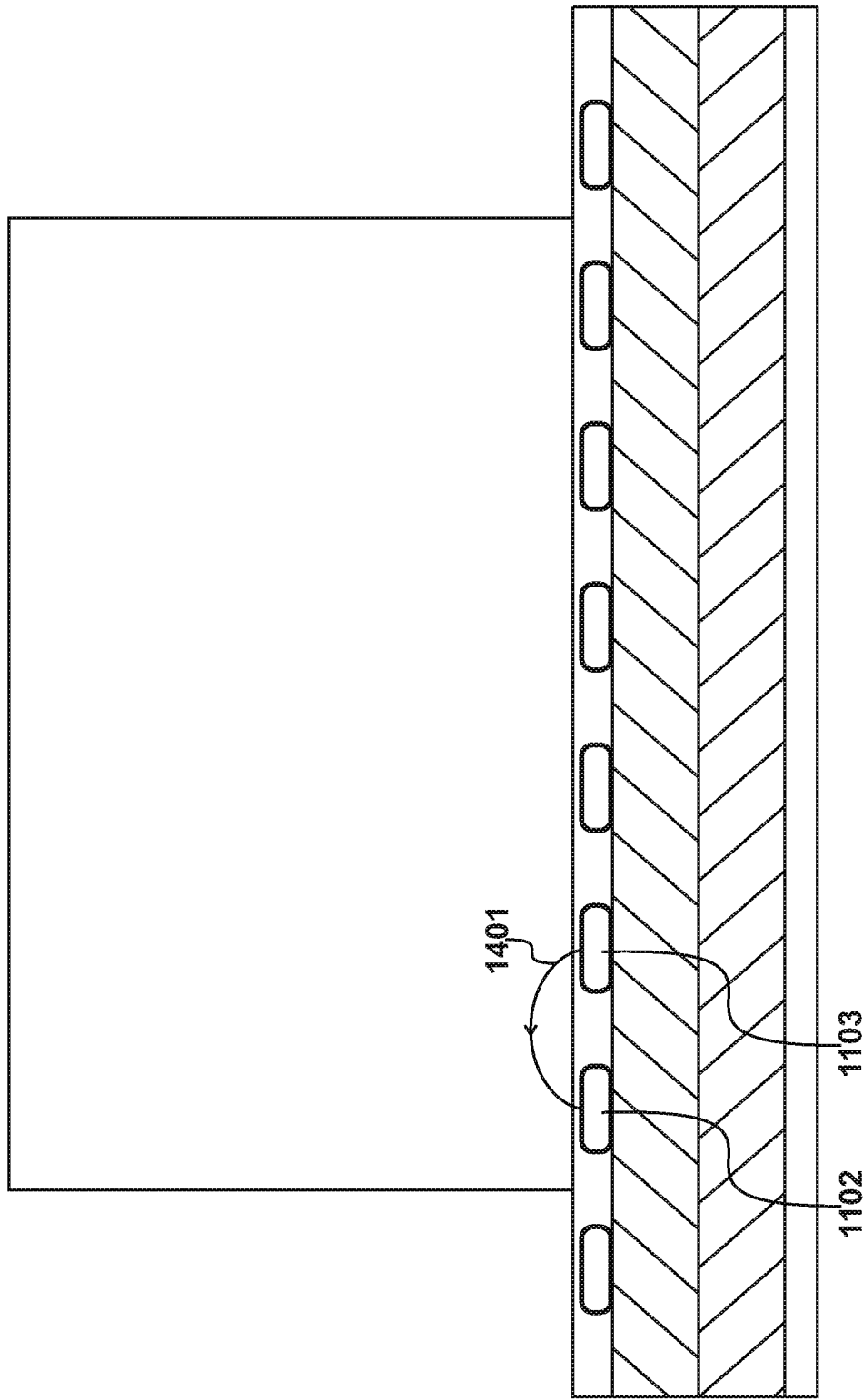
FIG. 14 shows a fourth coupling operation of the first embodiment.
Figure 15:
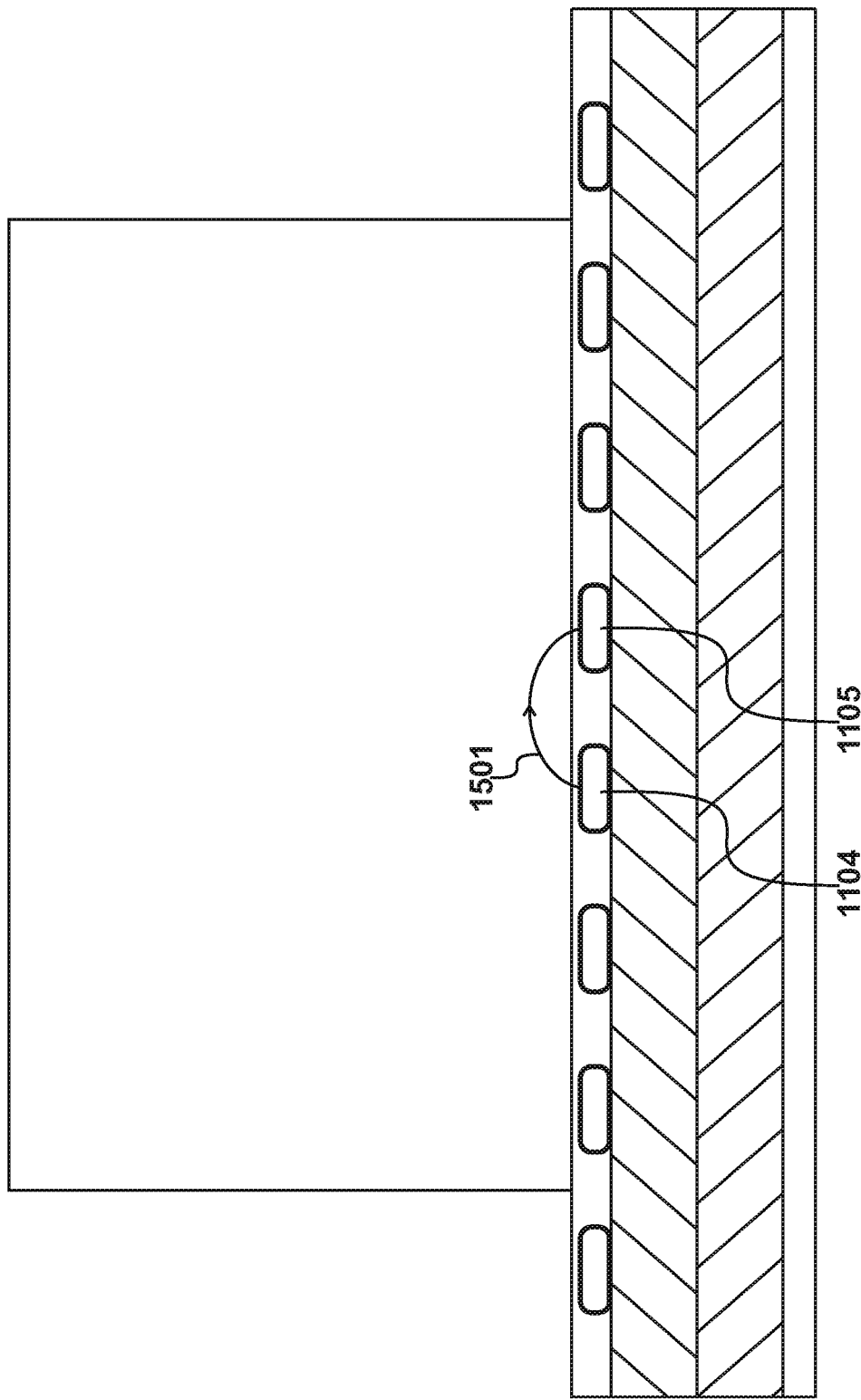
FIG. 15 shows a fifth coupling operation of the first embodiment.

As previously described with reference to FIG. 13, the reverse layering approach initially energizes the third electrode 1103 and monitors the first electrode 1101 during the third coupling operation 914. This is followed by energizing the third electrode 1103 again but on this occasion, during the fourth coupling operation 915, the second electrode 1102 is monitored. This results in the generation of electric field 1401. Thus, further coupled pairs of electrodes may be sequentially selected from the first set during respective sensing operations. Again, each includes a second electrode in common which, in the embodiment, achieves reversed layering. In the example shown in FIG. 14, the third electrode 1103 becomes the second electrode in common.

FIG. 15

In an embodiment, the completion of the fourth coupling operation 915 described above represents the completion of a scanning sub cycle 905 involving three electrodes. The next scanning sub cycle, in accordance with this embodiment, is initiated by energizing the fourth electrode 1104 and monitoring the fifth electrode 1105, to produce electric field 1501. Thus, this is similar to the first scanning operation described with reference to FIG. 11 and is followed by three further scanning operations that are similar to those described with reference to FIG. 12, FIG. 13 and FIG. 14; but displaced towards the right by three electrode positions.

FIG. 16

In an alternative embodiment, a sub cycle is deployed using four electrodes. Thus, a first sub cycle may deploy electrodes 1101 to 1104 and a second sub cycle may deploy electrodes 1105 to 1108.

At the start of a scan cycle, the first electrode 1101 is energized, with the second electrode being monitored, during a first coupling operation. As described with reference to FIG. 11, the third electrode is monitored on a second coupling operation 913, as described with reference to FIG. 12 and the fourth electrode 1104 is monitored during the third coupling operation 914, as illustrated in FIG. 16.

Figure 16:
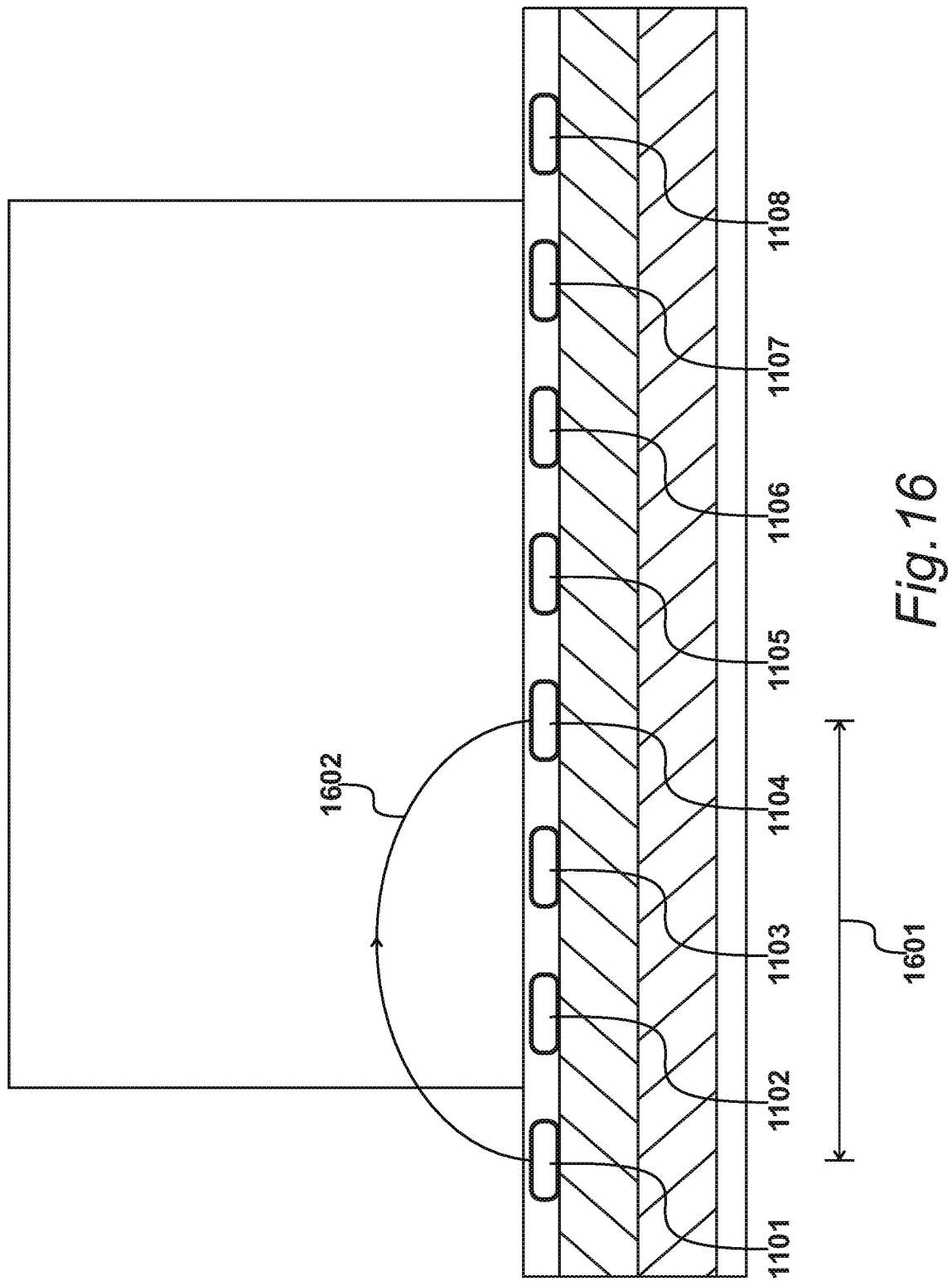
FIG. 16 shows an alternative third coupling operation of a second embodiment.

As shown in FIG. 16, the fourth electrode 1104 is separated from the first electrode 1101 by a third distance 1601 that is larger than the second distance 1204. In this way, the third coupling operation 914 penetrates deeper into the object 203 than the second coupling operation 913; as shown by electric field 1602.

In an embodiment, a third voltage is applied to the first electrode during the third coupling operation, in which the third voltage is higher than the second-voltage.

Thus, further coupled pairs are sequentially selected from the first set during respective coupling operations, with each further selected pair including the first electrode in common. In the example of FIG. 1, the first electrode 1101 remains as the first electrode in common, when coupled, during respective coupling operations, with the second electrode 1102, the third electrode 1103 and the fourth electrode 1104. In this embodiment, the first electrode in common maintains the same functionality during all of the coupling operations. In the example shown in FIG. 16, the electrode in common maintains the functionality of an energized-transmitter electrode, although, in an alternative embodiment, it would be possible for the first electrode in common to be selected for the alternative functionality of being a monitored-receiver electrode. However, it is not necessary for this same functionality to be maintained and the operations performed and described with reference to FIG. 16 represent an example of a possible mode of operation.

FIG. 17

Figure 17:
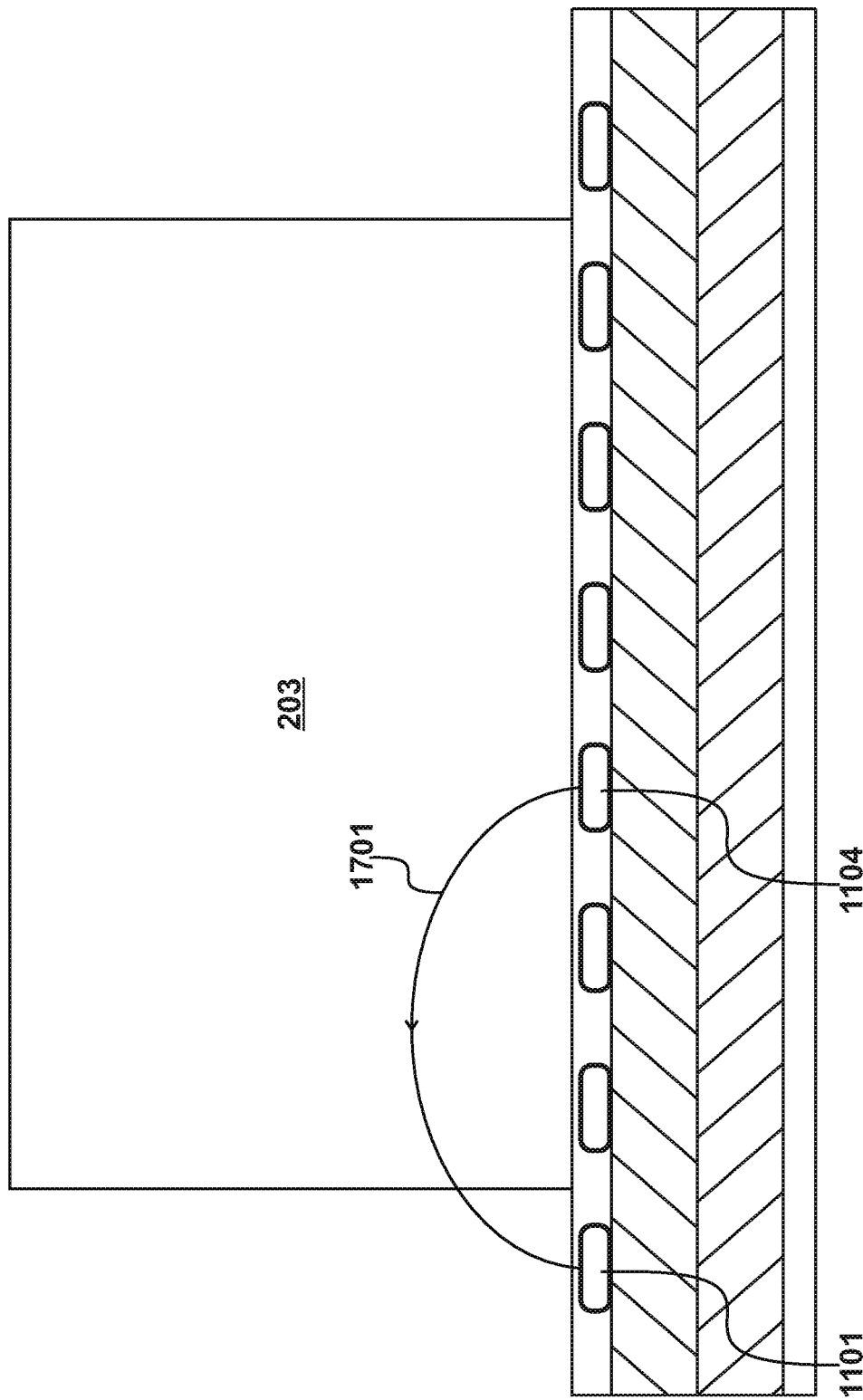
FIG. 17 shows a fourth coupling operation of the second embodiment.

Having completed forward scanning up to the fourth electrode 1104, it is then possible, in an embodiment, to perform reverse scanning. As shown in FIG. 17, the reverse scanning procedure may be initiated by energizing the fourth electrode 1104 and monitoring the first electrode 1103. This results in the generation of an electric field 1701 that passes through the object 203.

FIG. 18

Figure 18:
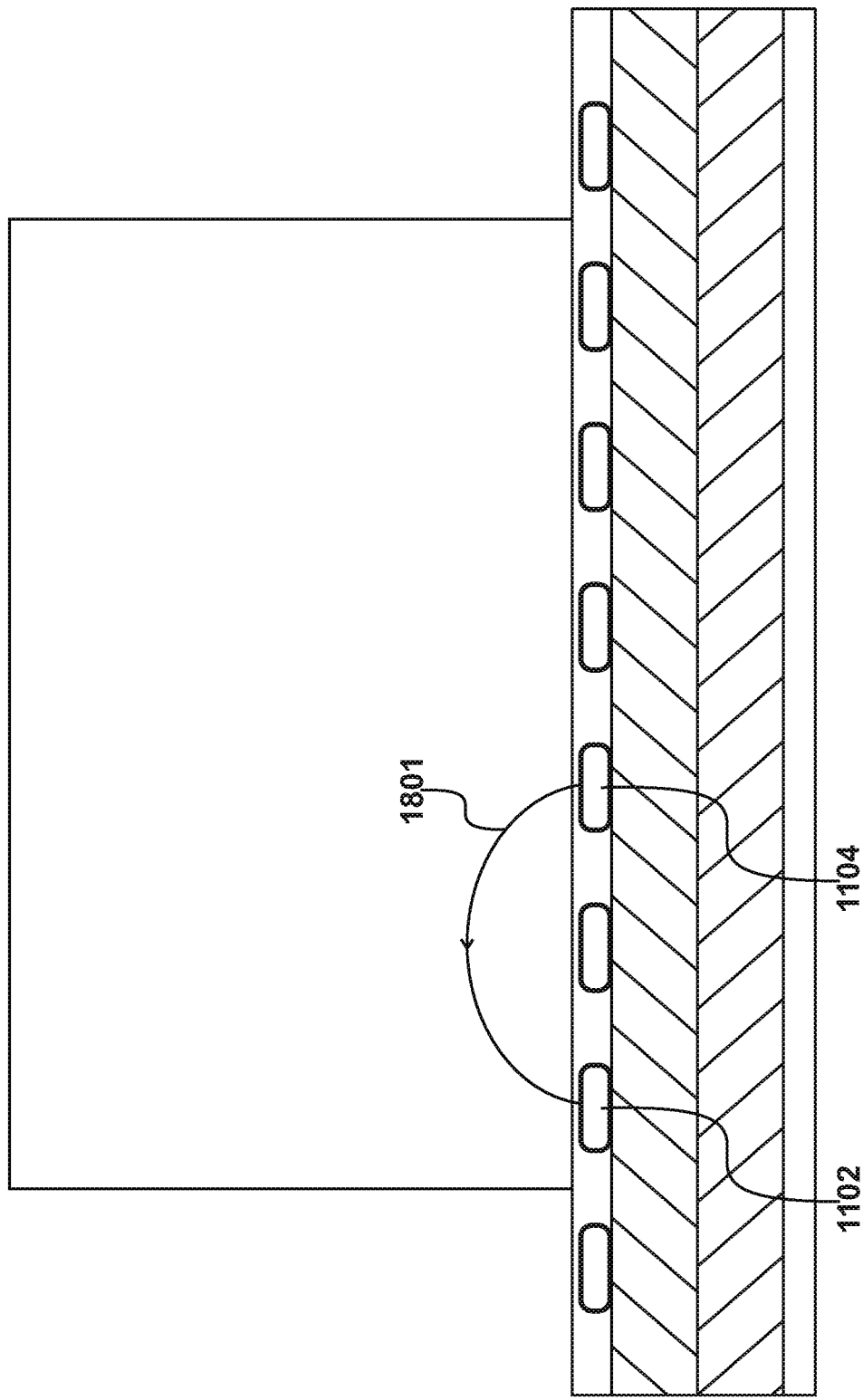
FIG. 18 shows a fifth coupling operation of the second embodiment.
Figure 19:
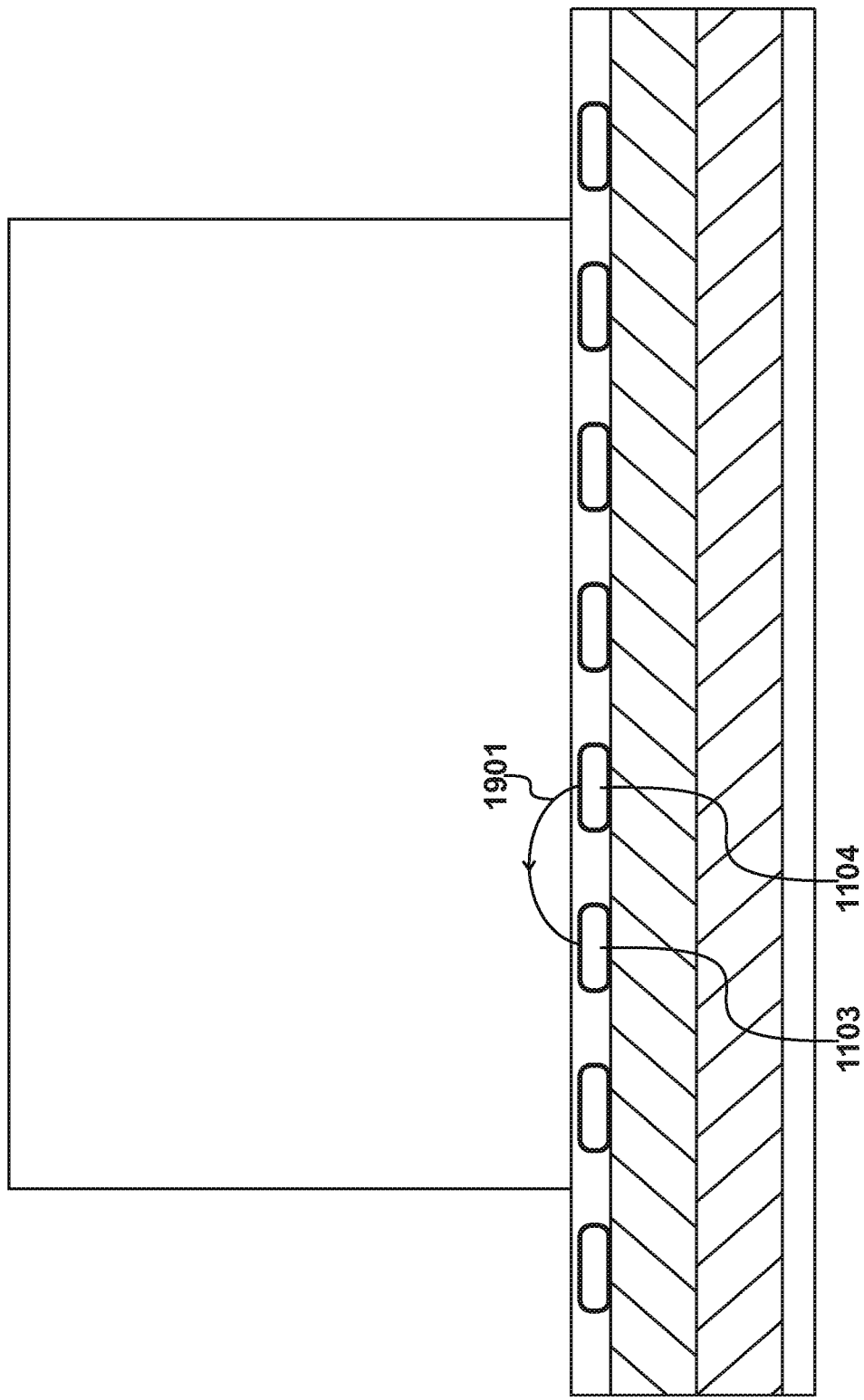
FIG. 19 shows a sixth coupling operation of the second embodiment.

Following the fourth coupling operation 914 described with reference to FIG. 17, a fifth coupling operation 916 is performed as illustrated in FIG. 18. Thus, on this occasion, the fourth electrode 1104 is energized again but the second electrode 1102 is monitored to produce an electric field 1801.

FIG. 19

In this embodiment, the sub-cycle is completed by again energizing the fourth electrode 1104 on the sixth coupling operation 917, while monitoring the third electrode 1103. On this occasion, an electric field 1901 is generated that passes through the object.

FIG. 20

Figure 20:
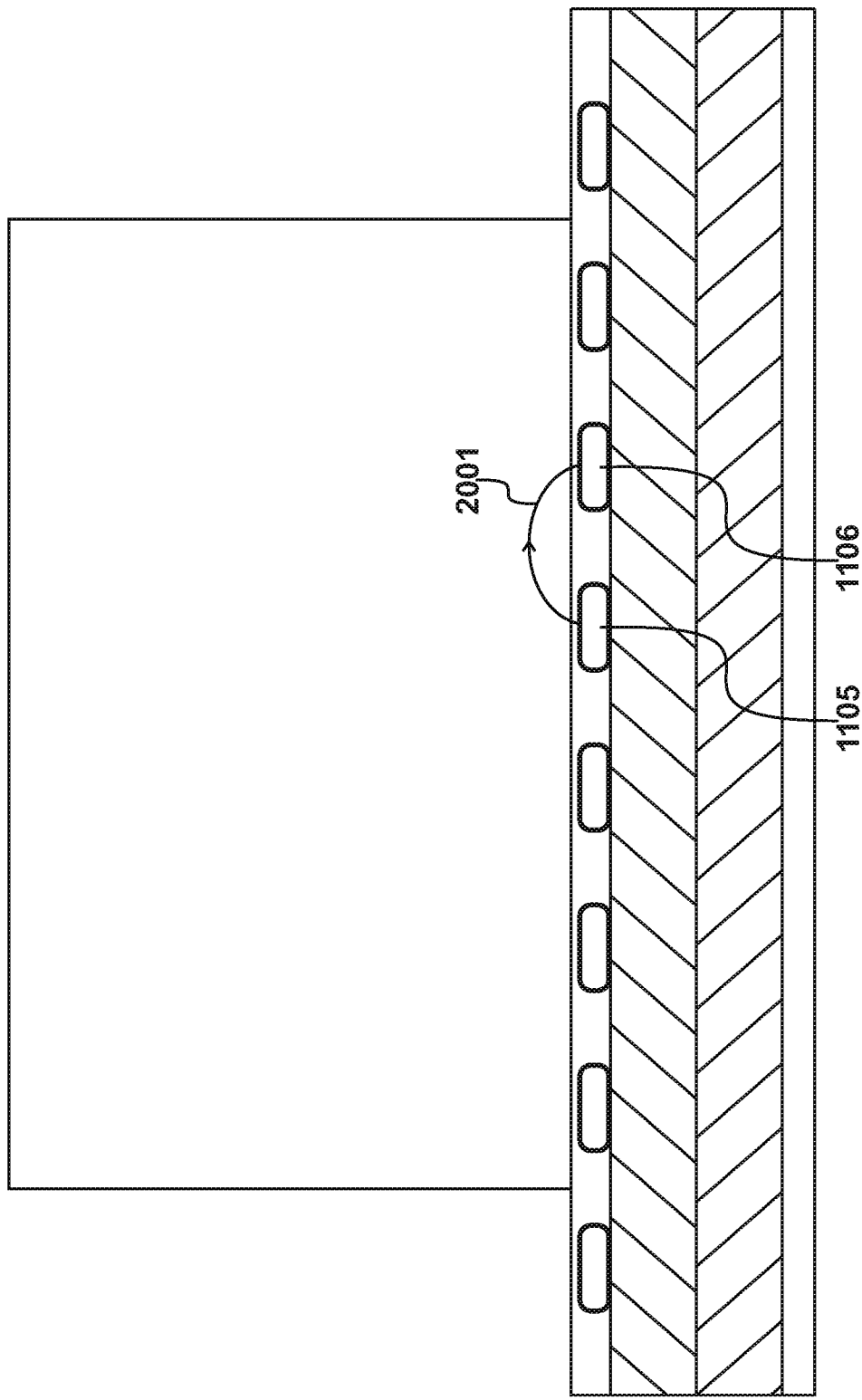
FIG. 20 shows a seventh coupling operation of the second embodiment.

Thus, a sub-cycle has been completed at the end of the sixth coupling operation, such that the seventh strobing operation, as shown in FIG. 20, moves on to the next sub cycle. Thus, during the next sub cycle, the fifth electrode 1105 is energized and the sixth electrode 1106 is monitored to produce an electric field 2001. Thus, this represents an alternative sub cycle which effectively repeats the first to the sixth coupling operations but displaced by four electrode positions.

FIG. 21

Figure 21:
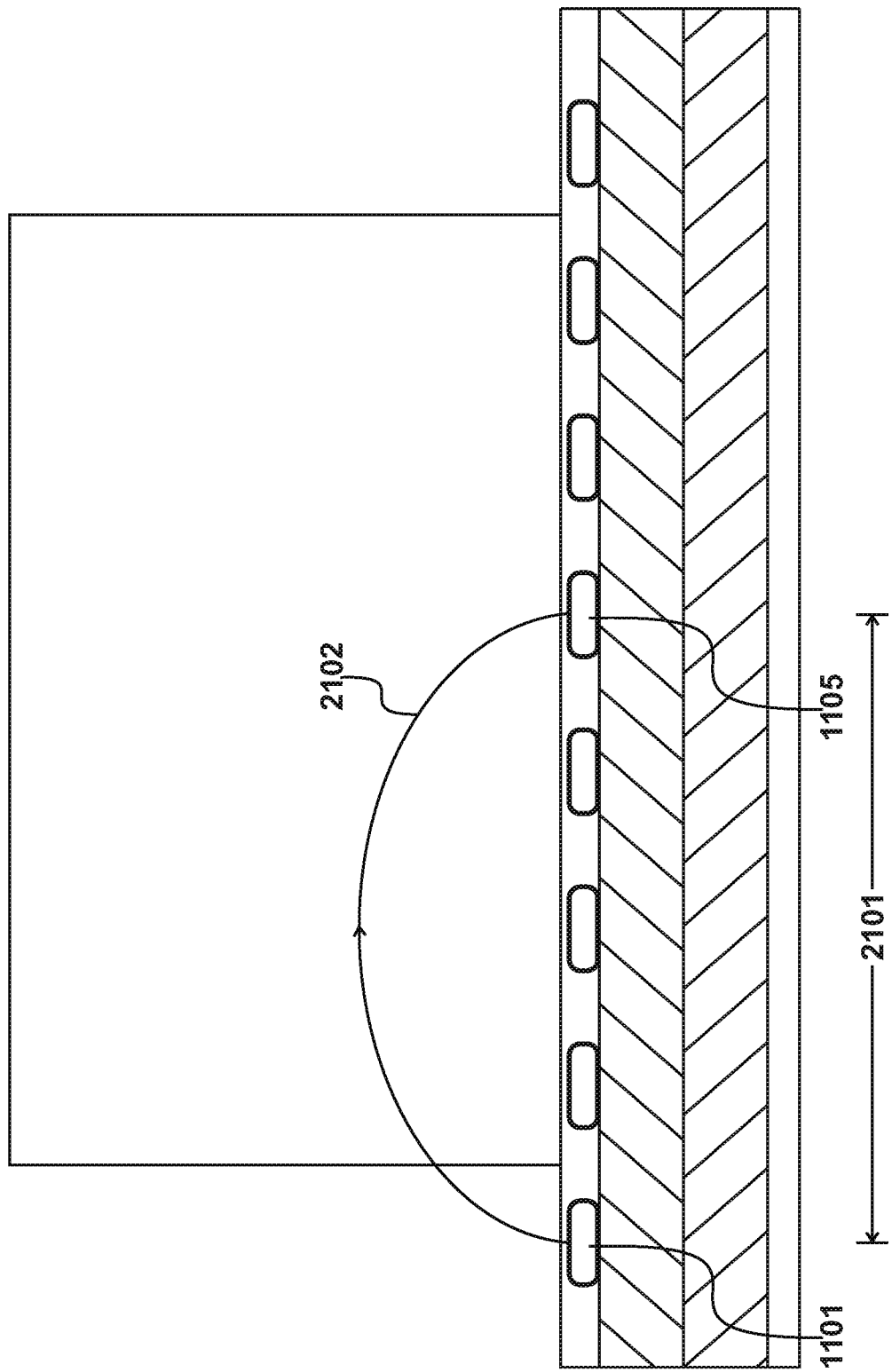
FIG. 21 shows a fourth coupling operation of the third embodiment.

In an alternative embodiment, the first electrode is again energized, this time during the fourth coupling operation 915 of the scanning cycle or sub cycle. However, depth penetration is increased, on this occasion, by monitoring the fifth electrode 1105 during the fourth coupling operation. As illustrated in FIG. 21, the fifth electrode 1105 is separated from the first electrode by a fourth distance 2101. The fourth distance is larger than the third distance, such that the fourth coupling operation penetrates deeper into an object than the third coupling operation, as illustrated by electric field 2102.

Again, in an embodiment, a fourth voltage is applied to the first electrode during this fourth strobing operation, where the fourth voltage is higher than the third voltage.

FIG. 22

Again, in this embodiment, reverse scanning may be performed over the five electrodes 1101 to 1105. To achieve this, the fifth electrode 1105 may be energized while the first electrode is monitored, the fifth electrode is energized again while the second electrode is monitored, the fifth electrode is again energized while the third electrode is monitored and finally the fifth electrode is again energized while monitoring the fourth electrode. The steps of energizing the fifth electrode may be performed in any order for a fifth coupling operation 916, a sixth coupling operation 917, a seventh coupling operation 918 and an eighth coupling operation 919.

Figure 22:
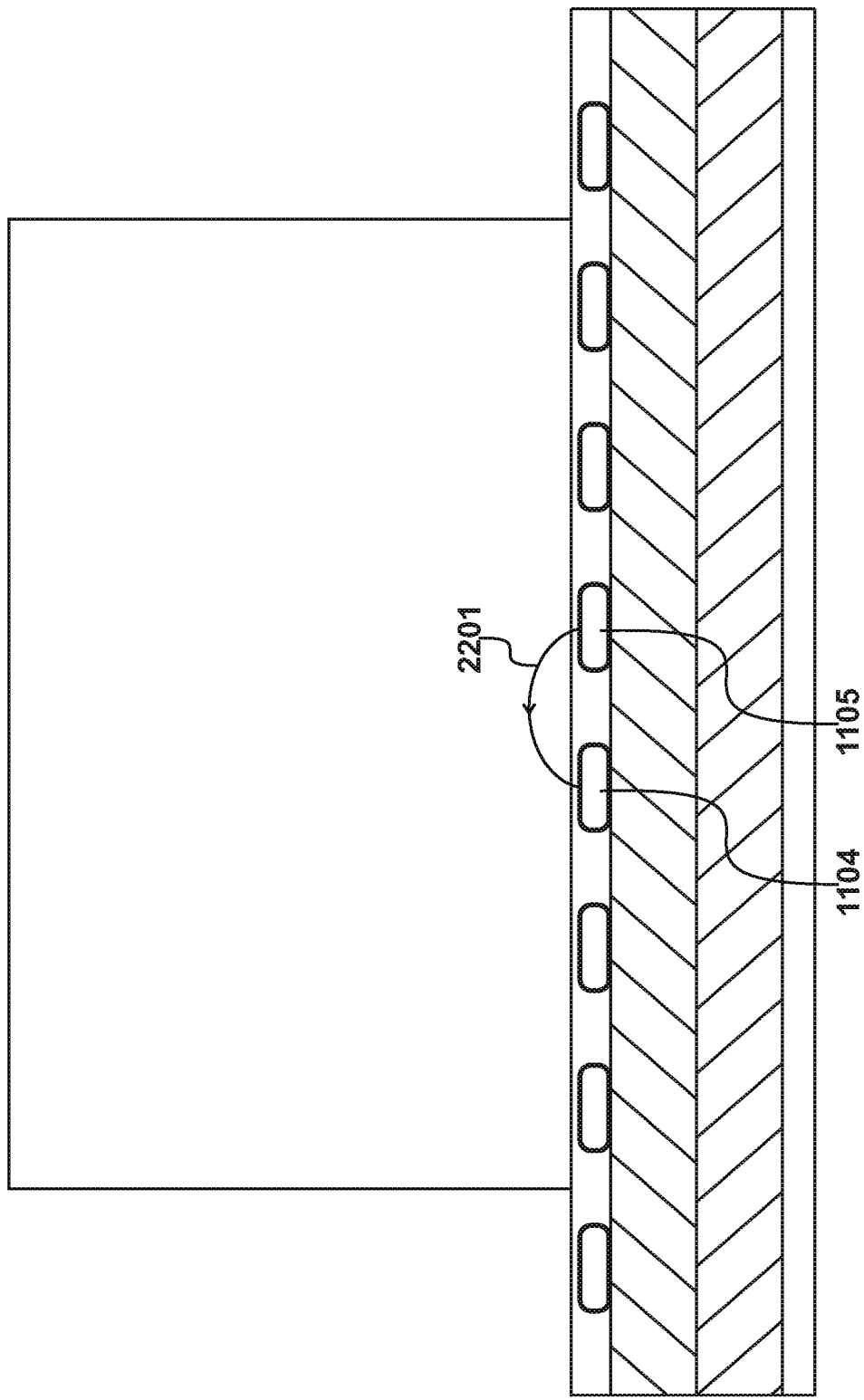
FIG. 22 shows a fifth coupling operation of the third embodiment.

As shown in FIG. 22, the fifth coupling operation, producing electric field 2201, consists of energizing the fifth electrode 1105 while monitoring the fourth electrode 1104.

FIG. 23

In this embodiment, the sixth coupling operation consists of energizing the fifth electrode 1105 while monitoring the third electrode 1103. This results in the generation of electric field 2301.

FIG. 24

Figure 23:
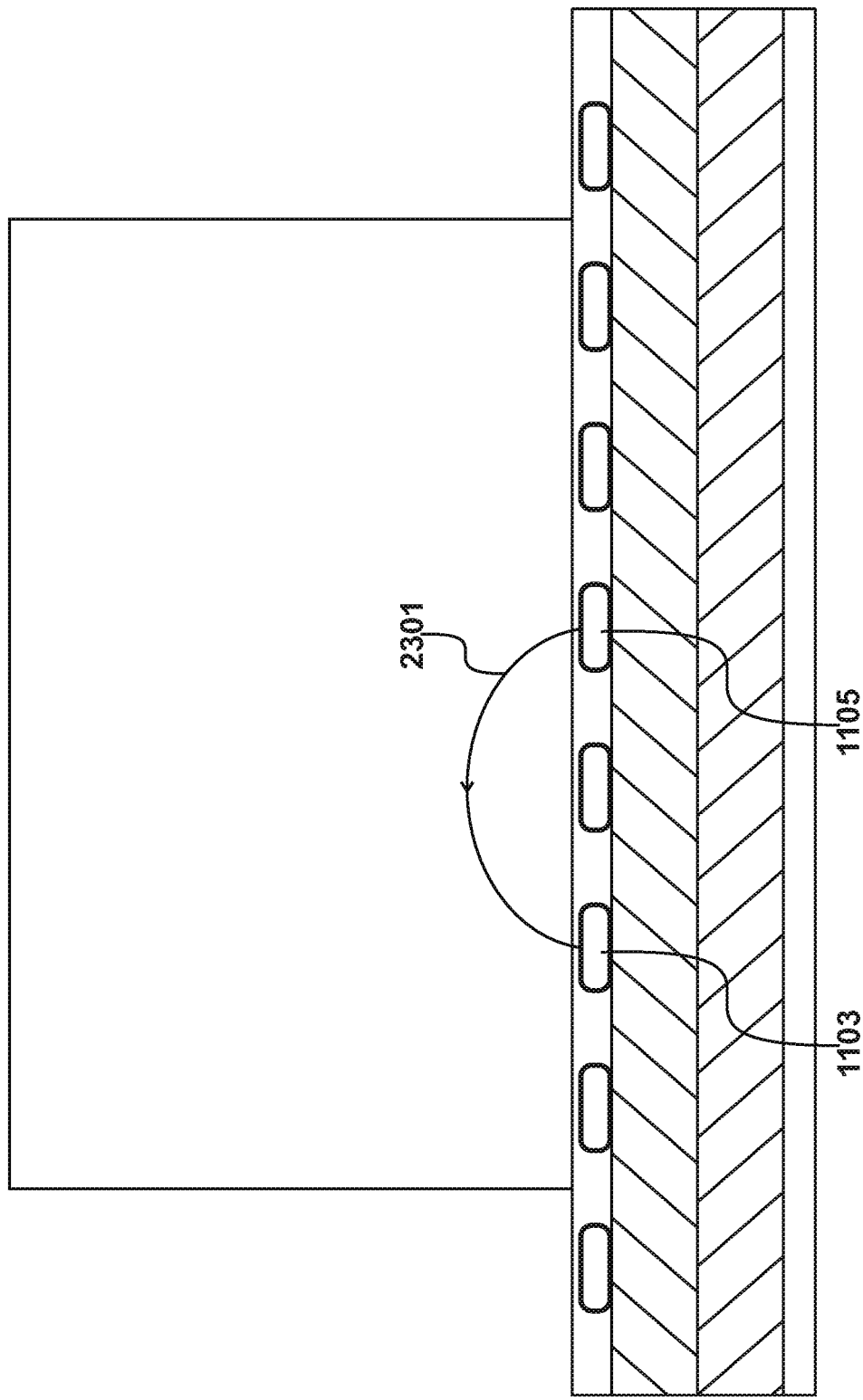
FIG. 23 shows a sixth coupling operation of the third embodiment.
Figure 24:
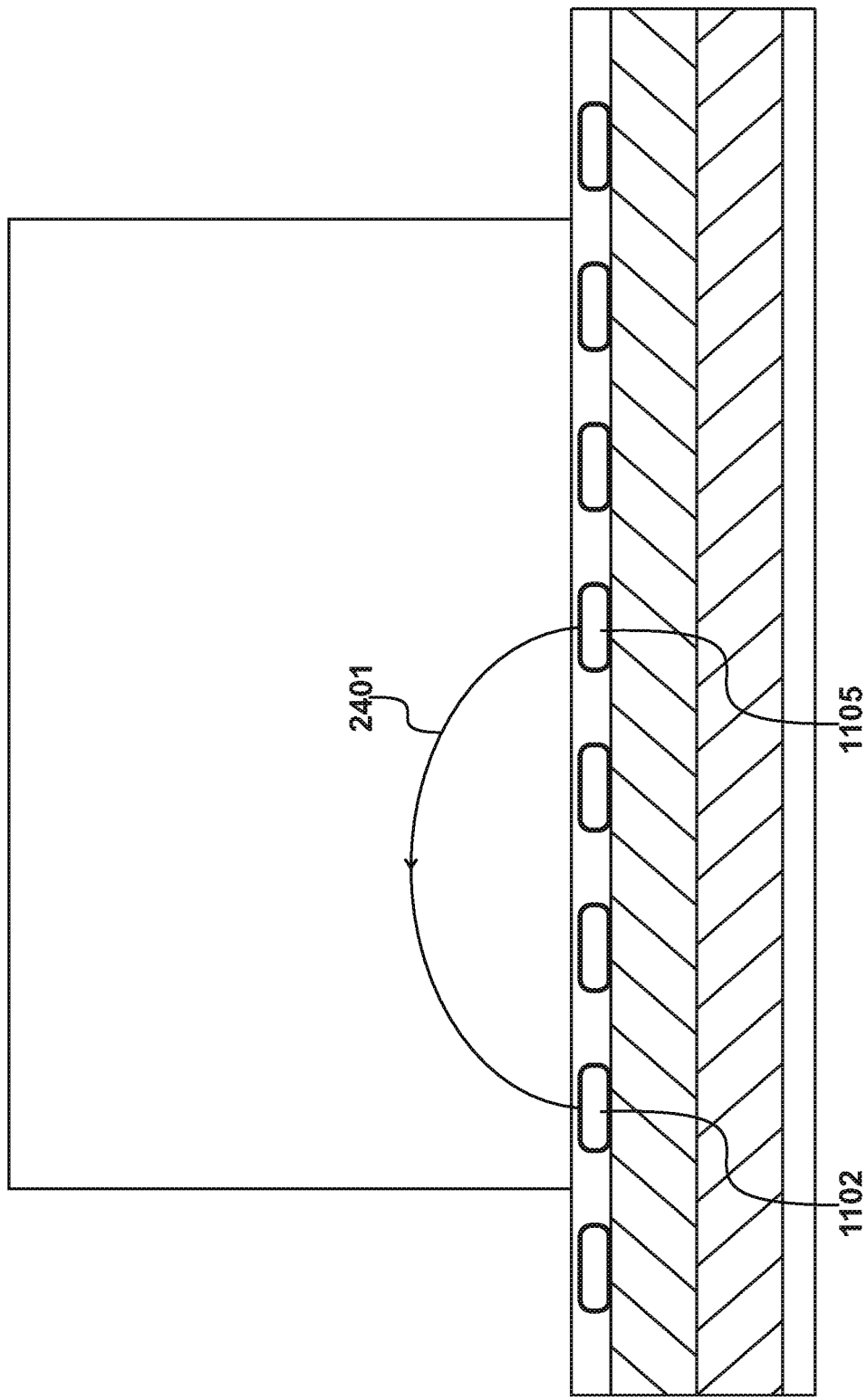
FIG. 24 shows a seventh coupling operation of the third embodiment.

Having performed the sixth coupling operation, as described with reference to FIG. 23, a seventh coupling operation is performed, in which the fifth electrode 1105 is energized again, while the second electrode 1102 is monitored. In this way, electric field 2401 is generated.

FIG. 25

Finally, to complete this sub-cycle of this embodiment, the fifth electrode 1105 is again energized, as the second electrode in common, while the first electrode 1101 is monitored. A more deeply penetrating electric field 2501 is generated.

Figure 25:
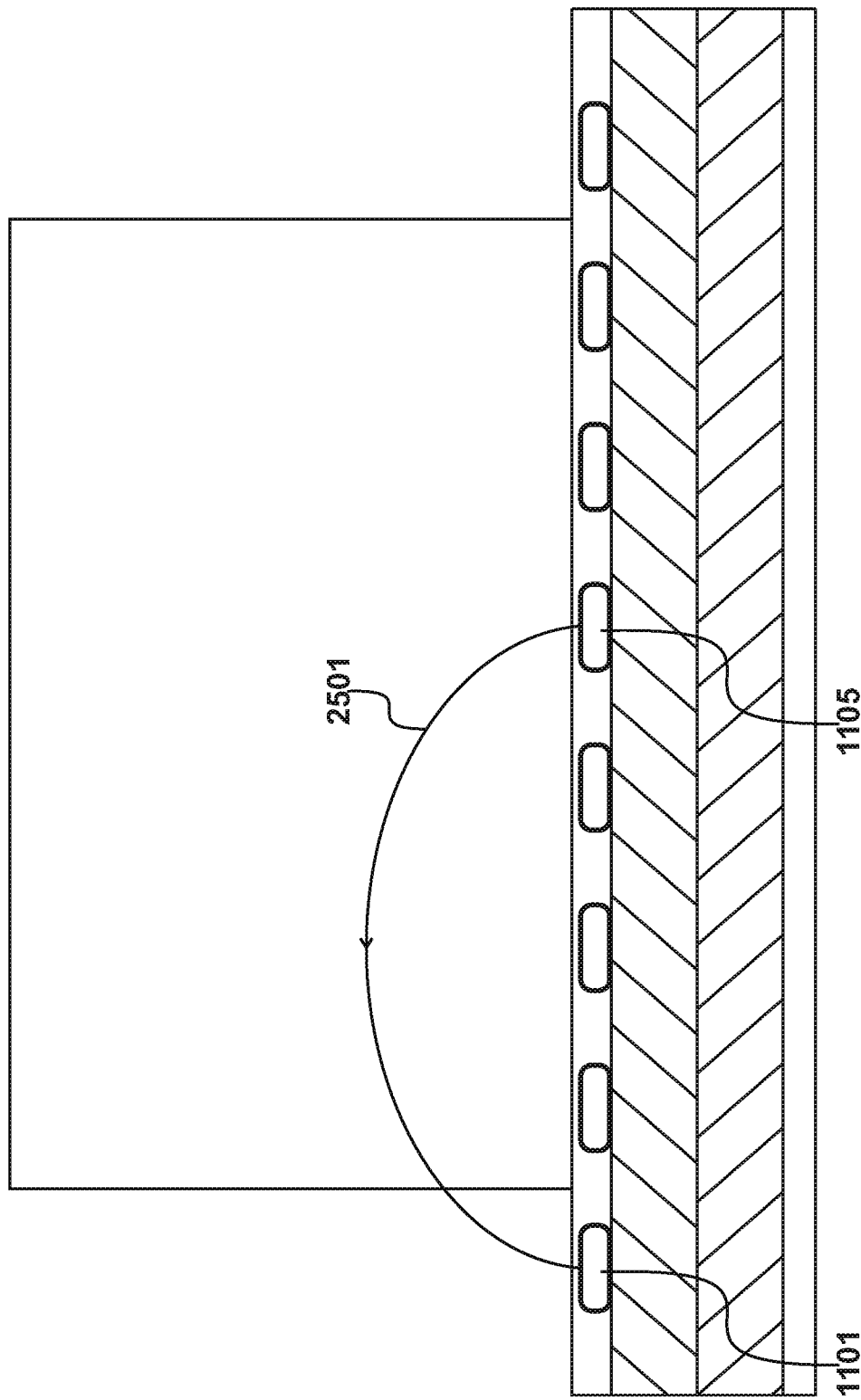
FIG. 25 shows an eighth coupling operation of the third embodiment.
Figure 26:
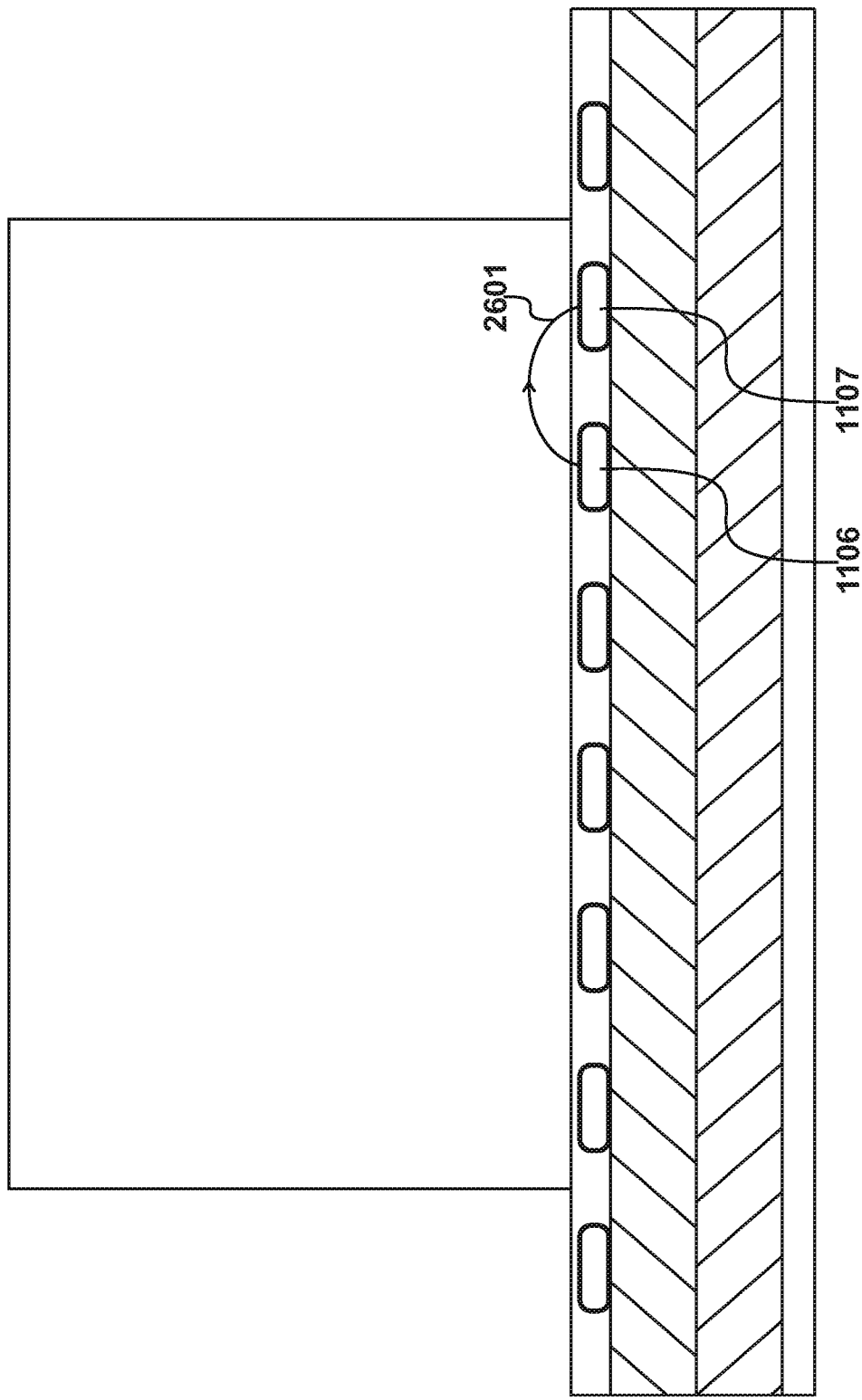
FIG. 26 shows a ninth coupling operation of the third embodiment.

Thus, in this embodiment, the completion of the eighth coupling operation, as illustrated in FIG. 25, represents the end of a scanning sub cycle.

FIG. 26

Having completed a scanning sub cycle, by the eighth coupling operation, the next scanning sub cycle is initiated by energizing the sixth electrode 1106. In this example, the ninth coupling operation 910 includes monitoring the seventh electrode 1107, thereby generating electric field 2601.

FIG. 27

In an alternative embodiment, having completed the first four coupling operations, a fifth coupling operation 916 consists of energizing the first electrode 1101 again, while monitoring the sixth electrode 1106. This in turn generates an electric field 2701 that penetrates more deeply into the object 203.

Figure 27:
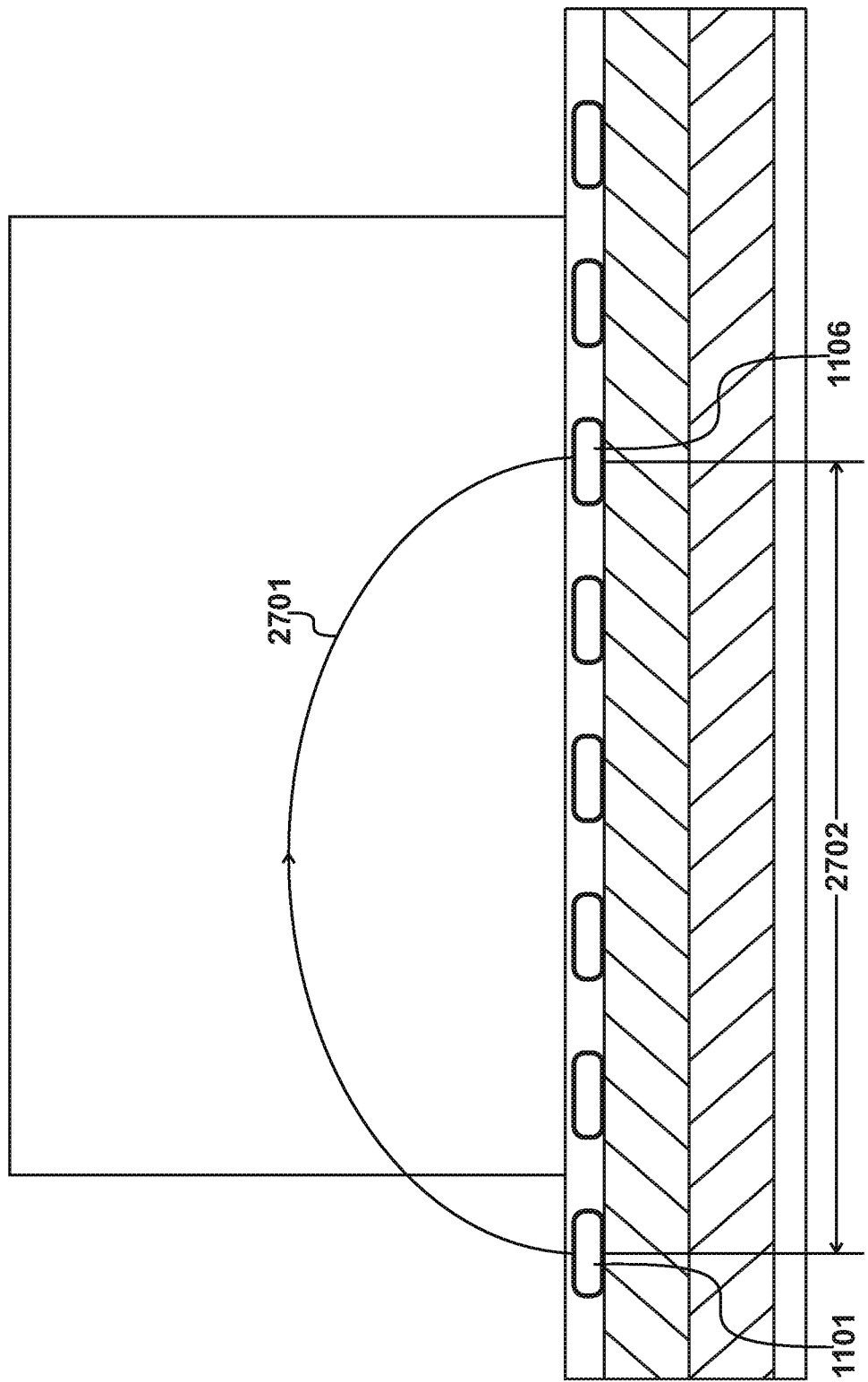
FIG. 27 shows a fifth coupling operation of a fourth embodiment.
Figure 28:
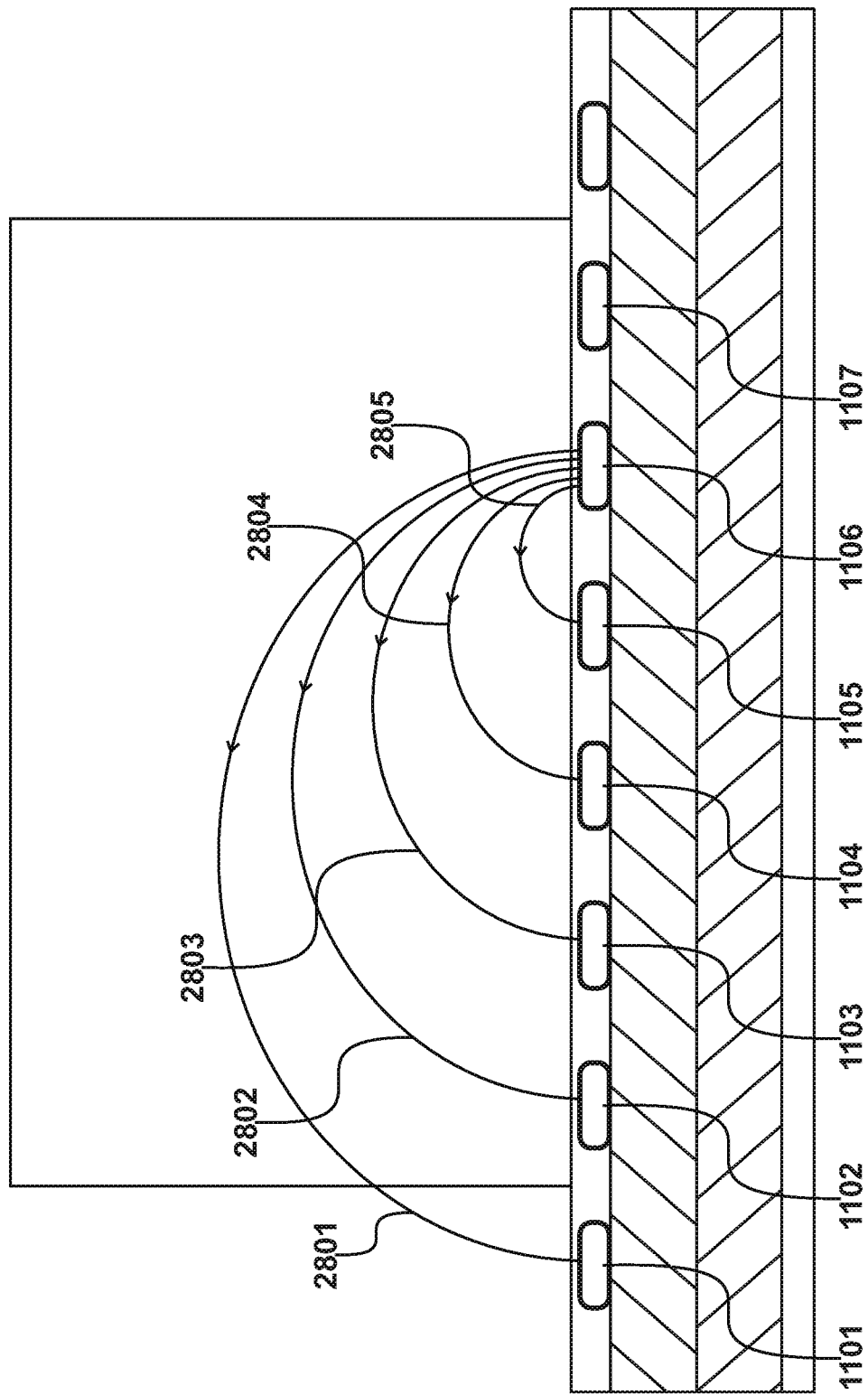
FIG. 28 shows sixth, seventh, eighth, ninth and tenth coupling operations of the fourth embodiment.
Figure 29:
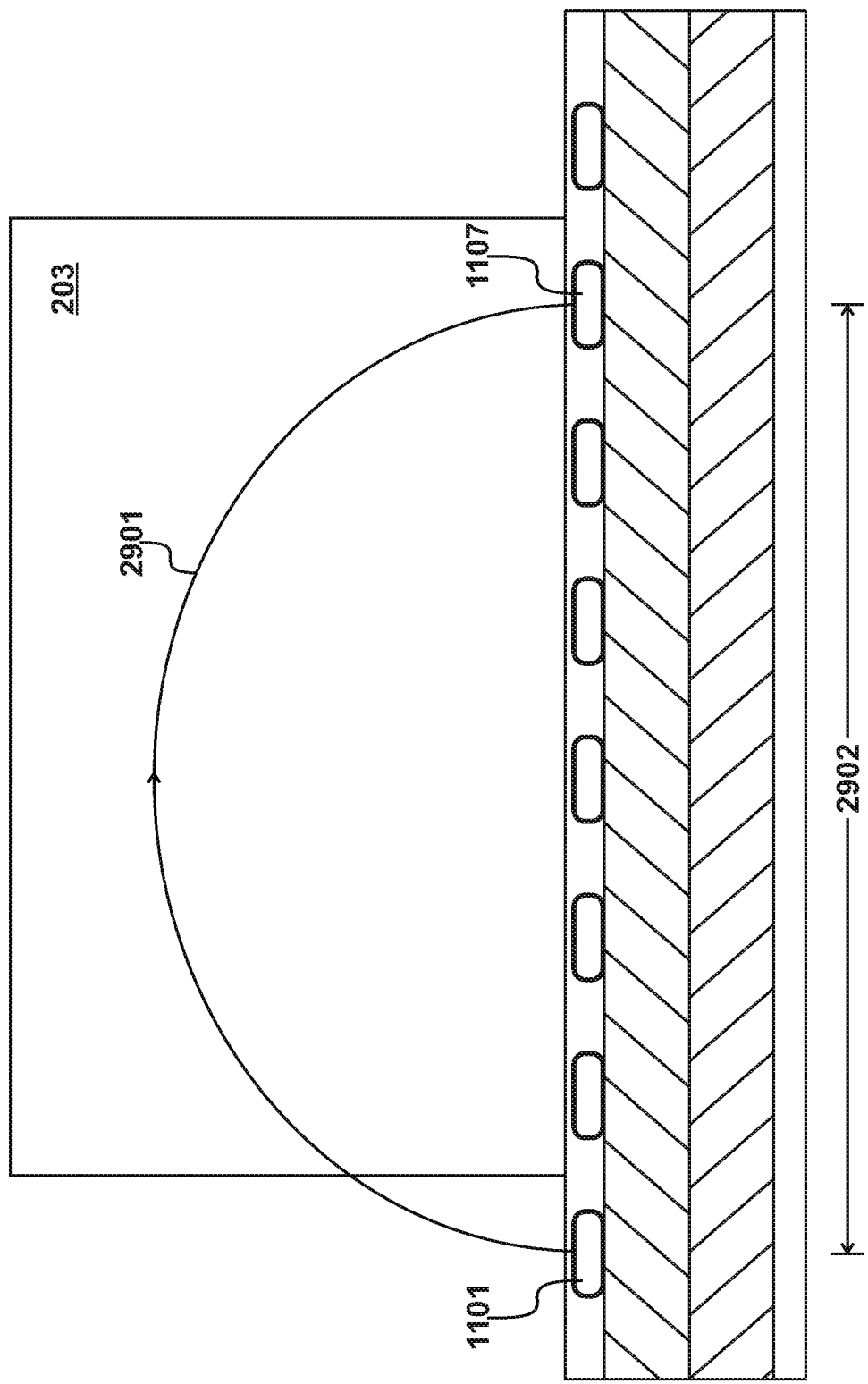
FIG. 29 shows a sixth coupling operation of a fifth embodiment.

As shown in FIG. 27, the sixth electrode 1106 is separated from the first electrode 1101 by a fifth distance 2702 that is larger than the fourth distance 2101. Thus, in this way, the fifth coupling operation penetrates deeper into the object than the fourth coupling operation.

In an embodiment, a fifth voltage is applied to the first electrode during the fifth coupling operation, which is higher than the fourth voltage.

FIG. 28

Again, in this embodiment, reverse scanning may be performed within the sub-cycle that includes six electrodes.

During a sixth coupling operation, the sixth electrode 1106 is energized and the first electrode 1101 is monitored, resulting in the generation of electric field 2801. During a seventh coupling operation, the sixth electrode is again energized while the second electrode is monitored, resulting in the generation of electric field 2802. During an eighth coupling operation 919, the sixth electrode is energized while monitoring the third electrode 1103, resulting in the generation of electric field 2803. During a ninth coupling operation 910, the sixth electrode is energized and the fourth electrode 1103 is monitored, resulting in the generation of electric field 2804. Finally, on the tenth coupling operation 911, the sixth electrode is energized and the fifth electrode is monitored, resulting in the generation electric field 2805.

Again, completing the tenth coupling operation may represent the end of a scanning sub cycle and the next scanning sub cycle may be initiated by energizing the seventh electrode 1107.

FIG. 29

In an alternative embodiment, during a scan cycle, the first electrode 1101 in common is again energized while the seventh electrode 1107 is monitored. Thus, the sixth coupling operation 917 results in the generation of electric field 2901 that penetrates further into the object 203.

In an embodiment, the seventh electrode 1107 is separated from the first electrode 1101 by a sixth distance 2902. The sixth distance 2902 is larger than the fifth distance 2702, such that the sixth coupling operation penetrates deeper into the object 203 than the fifth coupling operation.

In an embodiment, a sixth voltage is applied to the first electrode during the sixth coupling operation 917, where the sixth voltage is higher than the fifth voltage.

Again, the seventh electrode group may be used within a sub cycle and reverse layering may be performed.

FIG. 30

Figure 30:
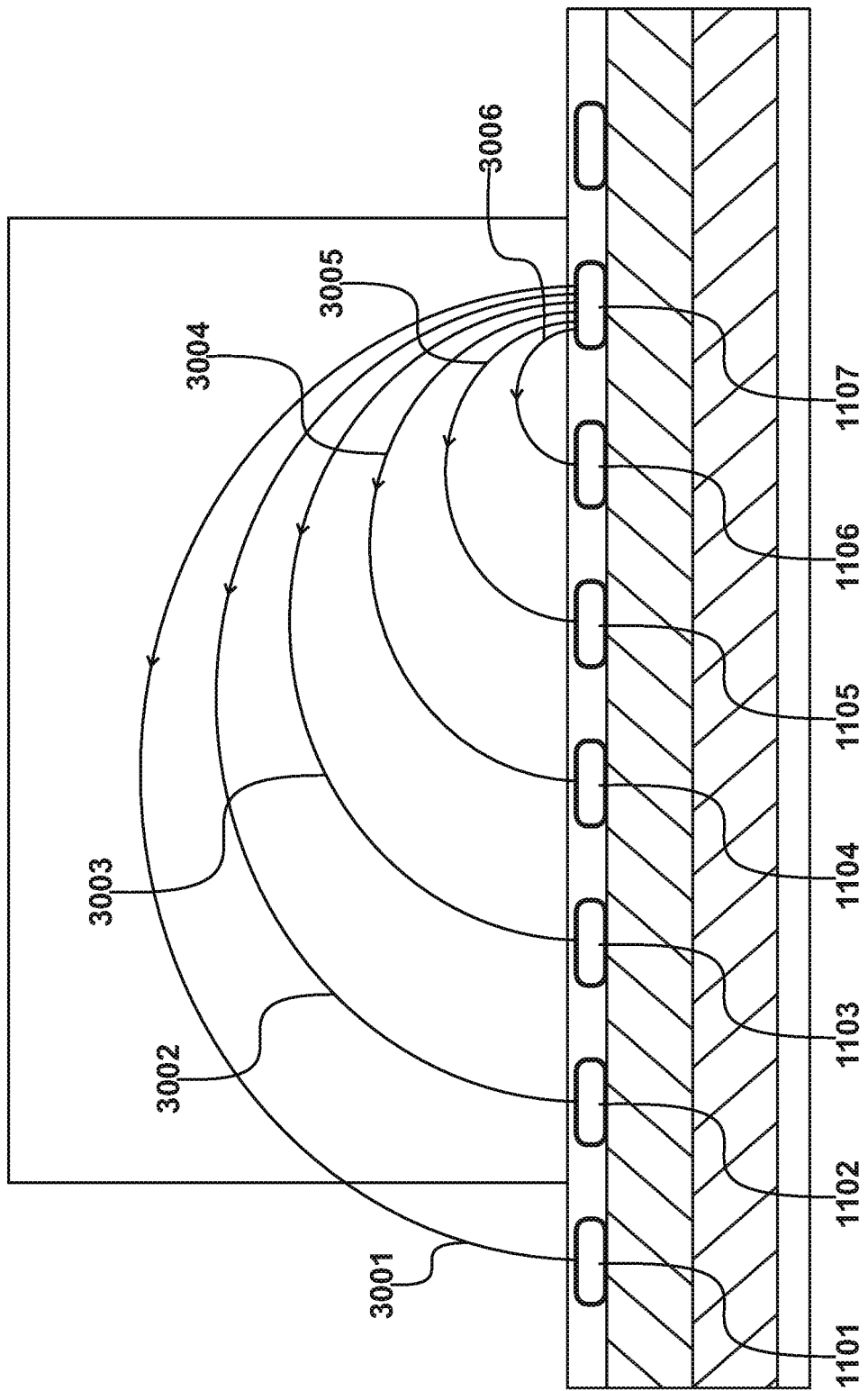
FIG. 30 shows seventh, eighth, ninth, tenth, eleventh and twelfth coupling operations of the fifth embodiment.

Reverse layering for the seven electrodes 1101 to 1107 is illustrated in FIG. 30. During respective coupling operations, the seventh electrode 1107 is energized six times, Thus, on a seventh coupling operation, the first electrode 1101 is monitored, resulting in the generation of electric field 3001. Thereafter, on the eighth coupling operation, electrode 1102 is monitored, resulting in the generation of an electric field 3002. On the ninth coupling operation, the third electrode 1103 is monitored, resulting in the generation of an electric field 3003. On the tenth coupling operation the fourth electrode 1104 is monitored, resulting in the generation of an electric field 3004. On the eleventh coupling operation, the fifth electrode 1105 is monitored, resulting in the generation of an electric field 3005. Finally, on the twelfth coupling operation, the sixth electrode 1106 is monitored, resulting in a generation of an electric field 3006.

Again, having completed a scanning sub cycle, by the twelfth coupling operation 924, the next sub-cycle may be initiated by energizing the eighth electrode 1108.

FIG. 31

In an alternative embodiment, during a scan cycle, the first electrode 1101 is again energized while this time monitoring the eighth electrode 1108. Thus, the seventh coupling operation results in the generation of an electric field 3101 that penetrates further into the object 203. In an embodiment, the eighth electrode 1108 is separated from the first electrode 1101 by a seventh distance 3102. The seventh distance 3102 is larger than the sixth distance 2902, such that the seventh coupling operation penetrates deeper into the object, compared to the sixth coupling operation.

In an embodiment, a seventh voltage is applied to the first electrode during the seventh coupling operation, where the seventh voltage is higher than the sixth voltage.

FIG. 32

Figure 32:
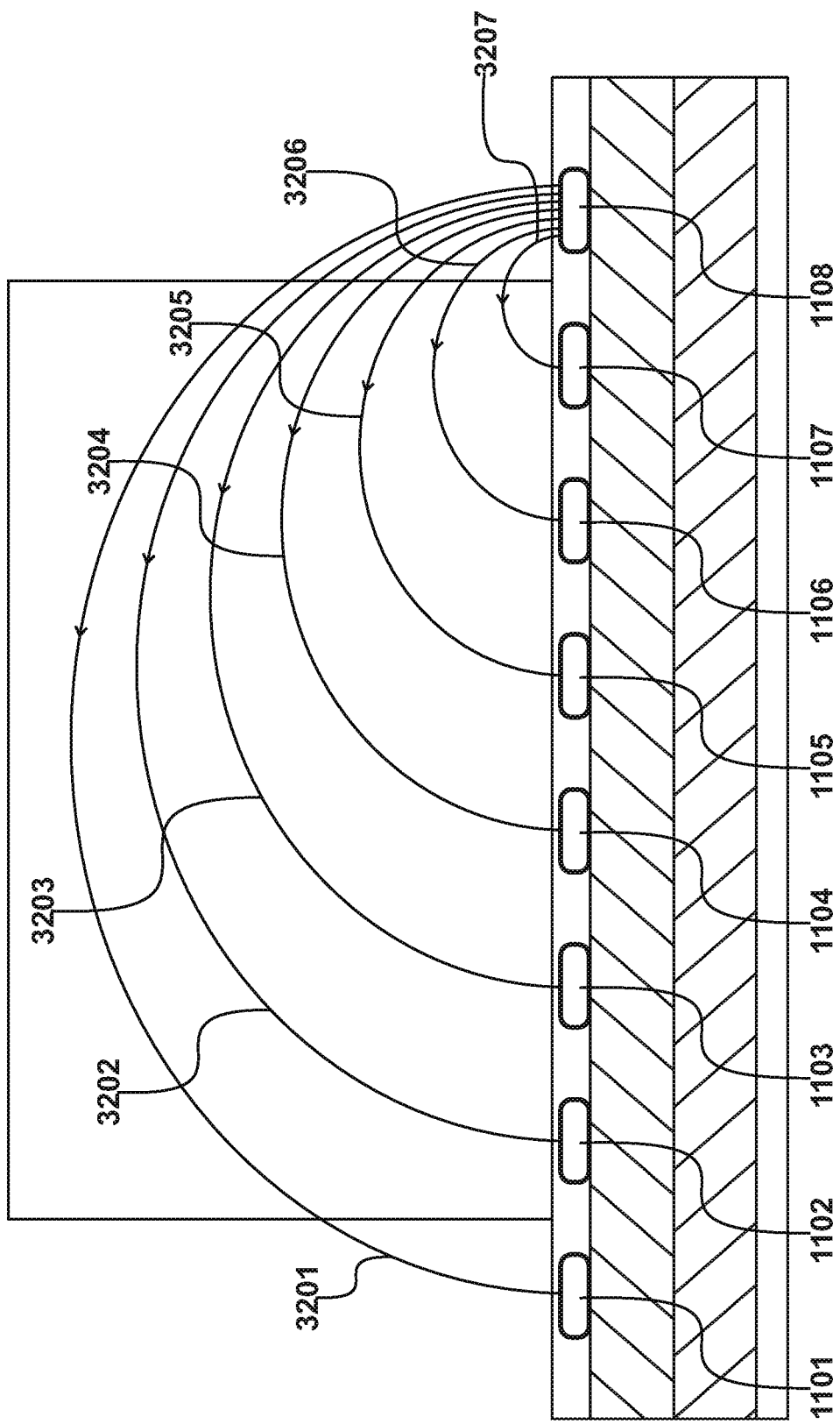
FIG. 32 shows eighth, ninth, tenth, eleventh, twelfth, thirteenth and fourteenth coupling operations of the sixth embodiment.

Again, in this embodiment, reverse scanning may be performed within the sub-cycle that now includes eight electrodes, as illustrated in FIG. 32. The electrodes may be energized in any order. However, the order shown in FIG. 32 has advantages, given that operational conditions, particularly in terms of the applied voltage, may be similar when energising the eighth electrode 1108 and monitoring the first electrode 1101, compared to energising the first electrode 1101 and monitoring the eighth electrode 1108.

Consequently, in this embedment, to perform reverse layering, the eighth electrode 1108 is energized on the eighth coupling operation and the first electrode 1101 is monitored, resulting in electric field 3201. On the ninth coupling operation, the eighth electrode 1108 is energized again and electric field 3202 is produced by monitoring the second electrode 1102. On the third coupling operation, the third electrode 1103 is monitored in response to energizing of the eighth electrode 1108 and the generation of electric field 3203. On the twelfth coupling operation, the eighth electrode 1108 is energized again, with the fourth electrode 1104 being monitored to produce electric field 3204. On the thirteenth coupling operation, the eighth electrode is energized again and the sixth electrode 1106 is monitored to produce electric field 3207. Finally, on the fourteenth coupling operation, in response to the eighth electrode 1108 being energized again, the seventh electrode 1107 is monitored thereby producing electric field 3208.

Figure 31:
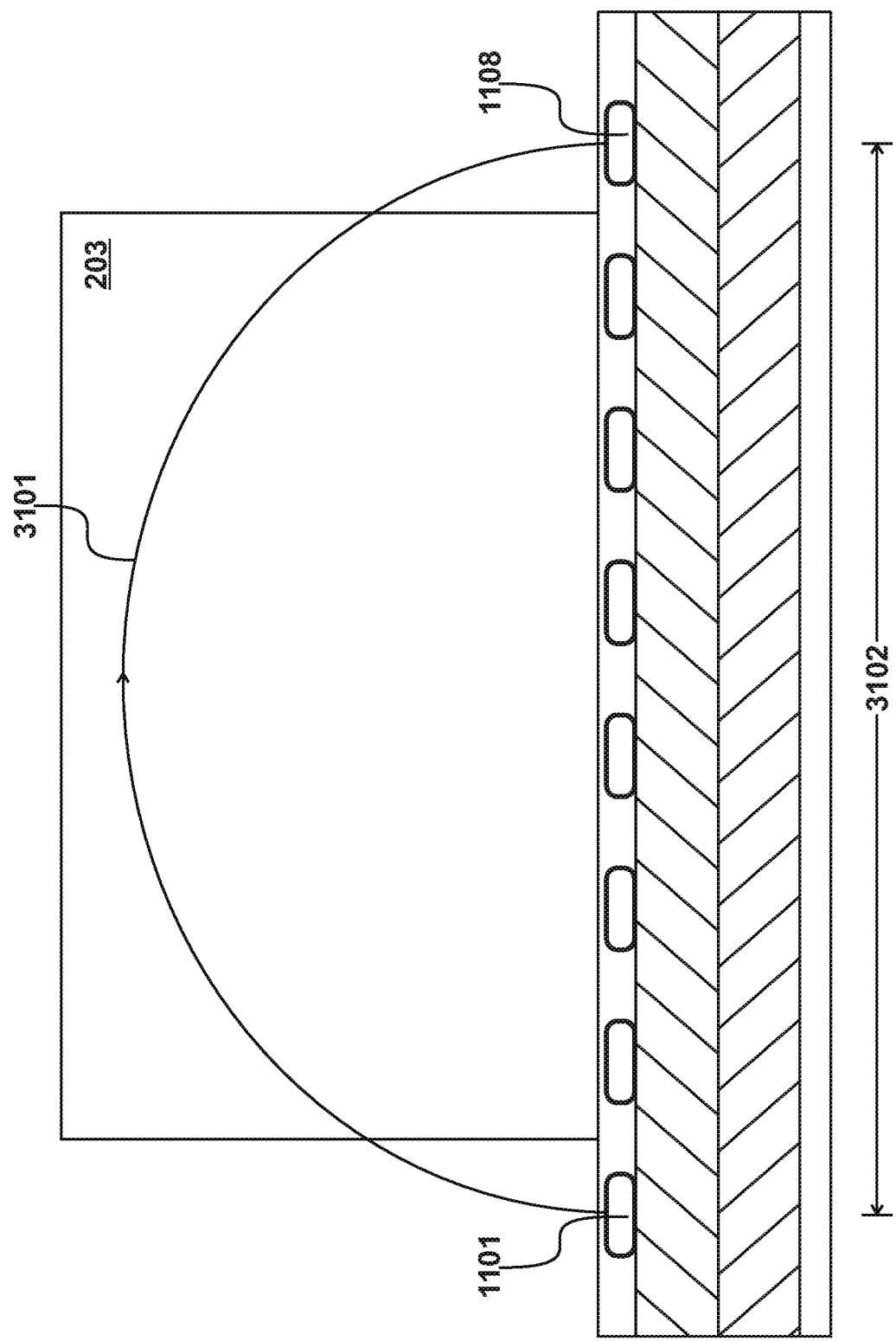
FIG. 31 shows a seventh coupling operation of the sixth embodiment.

An embodiment, as illustrated in FIG. 31, includes a first end electrode 1101 and a second end electrode 1108, In this embodiment, the first electrode is selected as the first electrode in common, as described with reference to FIG. 31. Thereafter, the second end electrode 1108 is selected as the second electrode in common, as described with reference to FIG. 32.

It should also be noted that, in alternative embodiments, coupled pairs of electrodes are selected from a second set of electrodes, again the set including an electrode in common.

What we claim is:

1. An apparatus for examining, using electric fields, objects placed on said apparatus, comprising:
   a first set of electrodes having a first end electrode and a second end electrode;
   an energising circuit for energising a selected one of said electrodes as a transmitter;
   a monitoring circuit for monitoring a selected one of said electrodes as a receiver, such that an energised transmitter electrode and a monitored receiver electrode establish a coupled pair of capacitively coupled electrodes during a coupling operation; and
   a processor, wherein said processor is configured to:
   select two of said electrodes separated by a first distance as a first coupled pair during a first coupling operation;
   select two of said electrodes separated by a second distance as a second coupled pair during a second coupling operation, wherein:

said second distance is larger than said first distance, and said first coupled pair and said second coupled pair both include said first end electrode;

sequentially select further coupled pairs of electrodes from said first set during respective coupling operations, each of said further coupled pairs including said first end electrode; and sequentially select still further coupled pairs of electrodes during respective coupling operations, each of said still further coupled pairs including said second end electrode.

2. The apparatus of claim 1, wherein said first set comprises between four and eight electrodes.

3. The apparatus of claim 1, further comprising a second set of electrodes, wherein said processor is configured to perform similar operations upon said second set as those performed upon said first set.

4. The apparatus of claim 1, wherein said energising circuit includes a strobing circuit for applying an input pulse to energise each selected transmitter electrode.

5. The apparatus of claim 4, wherein said strobing circuit adjusts an energy of said input pulse dependent upon a distance of said monitored receiver electrode from said energised transmitter electrode.

6. The apparatus of claim 4, further comprising:
a de-multiplexing device for applying said input pulse to any selected transmitter electrode; and
a multiplexing device for multiplexing a monitored output signal from any selected receiver electrode.

7. The apparatus of claim 6, wherein said monitoring circuit includes a signal-conditioning circuit for receiving multiplexed output signals, wherein:
said signal-conditioning circuit supplies conditioned output signals to said processor, and
said processor is configured to digitize said conditioned output signals.

8. A method of examining objects using electric fields created by a first set of electrodes having a first end electrode and a second end electrode, in which:
an object to be examined is placed above said first set;
a selected electrode from said first set is energized as a transmitter; and
a different selected electrode is monitored as a receiver, to establish a capacitively coupled pair of electrodes defining a coupling operation, comprising steps of:
selecting two electrodes of said first set separated by a first distance as a first coupled pair, during a first coupling operation;
selecting two electrodes separated by a second distance as a second coupled pair, during a second coupling operation, wherein:
said second distance is larger than said first distance, and
said first coupled pair and said second coupled pair both include said first end electrode;
sequentially selecting further coupled pairs of electrodes from said first set during respective coupling operations, each of said further coupled pairs including said first end electrode; and
sequentially selecting still further coupled pairs of electrodes from said first set during respective sensing operations, each of said still further coupled pair including said second end electrode.

9. The method of claim 8, wherein:
said first end electrode maintains a same functionality during all coupling operations, and said same functionality is selected from options comprising an energised-transmitter electrode and a monitored-receiver electrode.

10. The method of claim 8, further comprising a step of sequentially selecting coupled pairs of electrodes from a second set of electrodes, each including an electrode in common.

11. The method of claim 8, further comprising steps of:
multiplexing output signals received from any selected receiver electrode;
conditioning said multiplexed output signals to produce conditioned output signals; and
digitizing said conditioned output signals.

12. The method of claim 8, further comprising a step of adjusting a level of energising a selected transmitter electrode dependent upon a distance of a coupled monitored electrode from said selected transmitter electrode.

13. The method of claim 12, further comprising a step of applying an input pulse to energise said selected transmitter electrode.

14. The method of claim 13, further comprising a step of directing said input pulse to any selected transmitter electrode via a de-multiplexing operation.

15. An apparatus for examining, using electric fields, objects placed on said apparatus, comprising:
a first set of electrodes;
an energising circuit for energising a selected one of said electrodes as a transmitter, wherein said energising circuit includes a strobing circuit for applying an input pulse to energise each selected transmitter electrode;
a monitoring circuit for monitoring a selected one of said electrodes as a receiver, such that an energised transmitter electrode and a monitored receiver electrode establish a coupled pair of capacitively coupled electrodes during a coupling operation;
a de-multiplexing device for applying said input pulse to any selected transmitter electrode; and
a multiplexing device for multiplexing a monitored output signal from any selected receiver electrode; and
a processor, wherein said processor is configured to:
select two of said electrodes separated by a first distance as a first coupled pair during a first coupling operation; and
select two of said electrodes separated by a second distance as a second coupled pair during a second coupling operation, wherein:
said second distance is larger than said first distance, and
said first coupled pair and said second coupled pair both include a first electrode in common.

16. The apparatus of claim 15, wherein said monitoring circuit includes a signal-conditioning circuit for receiving multiplexed output signals, wherein:
said signal-conditioning circuit supplies conditioned output signals to said processor, and
said processor is configured to digitize said conditioned output signals.

17. The apparatus of claim 15, wherein said strobing circuit adjusts an energy of said input pulse dependent upon a distance of said monitored receiver electrode from said energised transmitter electrode.

18. The apparatus of claim 15, further comprising a second set of electrodes, wherein said processor is configured to perform similar operations upon said second set as those performed upon said first set.

19. The apparatus of claim 15, wherein said first set comprises between four and eight electrodes.

20. The apparatus of claim 15, wherein:
a first set of electrodes having a first end electrode,
said first electrode in common is said first end electrode, and
said processor is further configured to sequentially select further coupled pairs of electrodes from said first set during respective coupling operations, each of said further coupled pairs including said first end electrode.

* * * * *